US012666777B2

(12) United States Patent
Oh et al.

(10) Patent No.: US 12,666,777 B2
(45) Date of Patent: Jun. 23, 2026

(54) LIGHT EMITTING DIODE HAVING PLURALITY OF LIGHT EMITTING CELLS

(71) Applicant: SEOUL VIOSYS CO., LTD., Ansan-si (KR)

(72) Inventors: Se Hee Oh, Ansan-si (KR); Wan Tae Lim, Ansan-si (KR); Sang Won Woo, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 545 days.

(21) Appl. No.: 18/040,904

(22) PCT Filed: Aug. 9, 2021

(86) PCT No.: PCT/KR2021/010461
§ 371 (c)(1),
(2) Date: Feb. 7, 2023

(87) PCT Pub. No.: WO2022/031138
PCT Pub. Date: Feb. 10, 2022

(65) Prior Publication Data
US 2023/0317763 A1 Oct. 5, 2023

(30) Foreign Application Priority Data

Aug. 7, 2020 (KR) ........................ 10-2020-0099310
Aug. 6, 2021 (KR) ........................ 10-2021-0103559

(51) Int. Cl.
*H10H 29/14* (2025.01)
(52) U.S. Cl.
CPC ................................ *H10H 29/142* (2025.01)

(58) Field of Classification Search
None
See application file for complete search history.

(56) References Cited

U.S. PATENT DOCUMENTS

| | | | |
|---|---|---|---|
| 2015/0200334 A1 | 7/2015 | Chae et al. | |
| 2018/0269354 A1* | 9/2018 | Oh ........................ | H10H 20/856 |
| 2018/0323236 A1 | 11/2018 | Oh et al. | |
| 2019/0189680 A1* | 6/2019 | Oh ........................ | H10H 20/835 |
| 2019/0280178 A1 | 9/2019 | Oh et al. | |
| 2019/0296204 A1 | 9/2019 | Oh et al. | |

FOREIGN PATENT DOCUMENTS

| | | |
|---|---|---|
| KR | 10-2012-0031343 A | 4/2012 |
| KR | 10-2017-0011138 A | 2/2017 |
| KR | 10-2018-0062347 A | 6/2018 |
| KR | 10-2018-0072279 A | 6/2018 |

OTHER PUBLICATIONS

European Search Report for European Application 21853239, dated Aug. 8, 2024.
Supplementary European Search Report from European Application No. 21853239, dated Dec. 10, 2024, (14 pages).
International Search Report from PCT/KR2021/010461 dated Dec. 7, 2021.

* cited by examiner

*Primary Examiner* — Sarah K Salerno
(74) *Attorney, Agent, or Firm* — Perkins Coie LLP

(57) ABSTRACT
A light emitting diode having a plurality of light emitting cells is provided. A light emitting diode according to an embodiment includes a reflection metal layer covering a region between light emitting cells, in which the reflection metal layer is disposed between connectors electrically connecting adjacent light emitting cells, and electrically insulated from a bump pad.

16 Claims, 24 Drawing Sheets

LIGHT EMITTING DIODE HAVING PLURALITY OF LIGHT EMITTING CELLS

This patent document is a 371 National Phase Application of International Patent Application No. PCT/KR2021/010461, filed Aug. 9, 2021, which further claims priority to and benefits of Korean Patent Application No. 10-2020-0099310, filed Aug. 7, 2020, and Korean Patent Application No. 10-2021-0103559, filed Aug. 6, 2021. The entire contents of the above noted applications are incorporated by reference as part of the disclosure of this document.

TECHNICAL FIELD

The present disclosure relates to a light emitting diode, and more particularly, to a light emitting diode having a plurality of light emitting cells.

BACKGROUND ART

In general, nitrides of group III elements such as gallium nitride (GaN) and aluminum nitride (AlN) have recently been in the spotlight as a material for light sources in the visible and ultraviolet regions, with favorable thermal stability and a direct transition type energy band structure. In particular, blue and green light emitting diodes using Indium Gallium Nitride (InGaN) have been used in various applications such as large-scale full color flat panel displays, traffic lights, indoor lighting, high-density light sources, high-resolution output systems, optical communication, and others.

The light emitting diodes are generally used in a form of a package through a packaging process. Recently, however, research on a chip-scale package type light emitting diode in which the packaging process is performed at a chip level is in progress. Since a size of this light emitting diode is smaller than that of a general package and an additional packaging process is not performed, the process can be further simplified and time and cost can be saved. The chip-scale package type light emitting diode generally has a flip-chip type electrode structure, and can dissipate heat using bump pads, thereby having favorable heat dissipation characteristics.

Moreover, the flip-chip type electrode structure improves light efficiency by reflecting light using a reflection metal layer.

Meanwhile, a light emitting diode in which a plurality of light emitting cells is connected in series has been being developed. This light emitting diode can be operated at a high voltage and low current, thereby reducing a droop phenomenon of the light emitting diode.

However, as a plurality of light emitting cells is included, a reflection structure that is configured to reflect light even in a region between the light emitting cells is required.

In addition, when the plurality of light emitting cells is connected in series, since bump pads are connected to one light emitting cell, heat dissipation through the bump pads may be limited in light emitting cells to which bump pads are not electrically connected. The bump pads can be formed across the plurality of light emitting cells so as to improve the heat dissipation characteristics of the light emitting diode, but a high electrical potential difference occurs between the bump pads and the electrodes of the light emitting cells, which may result in device failure due to insulation breakdown or electrical short.

Furthermore, in order to connect the plurality of light emitting cells in series, the bump pads are electrically connected to both terminals of the light emitting cells connected in series. Electrical characteristics of the light emitting diode are generally measured after connecting probes to the bump pads. For reliable contact of the probes, the probes are pressed against the bump pad, which may cause damage to the bump pad. Furthermore, damage occurs to an insulation layer under the bump pad, and thus, electrical short may be induced between the bump pad and a conductive metal layer disposed thereunder. This electrical short causes the light emitting diode to fail.

In addition, when the insulation layer is damaged due to generation of contaminants such as particles on the conductive metal layer, the bump pad may be electrically shorted to the conductive metal layer through the insulation layer, which may result in failure of the light emitting diode.

Accordingly, there is a need for a light emitting diode having a novel structure that is configured to safely measure electrical characteristics while having high light efficiency, and to be operated safely even under a high driving voltage.

DISCLOSURE

Technical Problem

Exemplary embodiments provide a light emitting diode having high reliability while having a plurality of light emitting cells connected in series.

Exemplary embodiments provide a flip chip type light emitting diode in a form of a chip scale package with improved heat dissipation performance through bump pads.

Technical Solution

A light emitting diode according to an embodiment of the present disclosure includes: light emitting cells, each including a first conductivity type semiconductor layer, an active layer, and a second conductivity type semiconductor layer, and arranged in a matrix; an ohmic reflection layer disposed on and in ohmic contact with the second conductivity type semiconductor layer of each of the light emitting cells; a lower insulation layer covering the light emitting cells and the ohmic reflection layers, and having openings exposing the first conductivity type semiconductor layer and the ohmic reflection layer of each of the light emitting cells; connectors disposed on the lower insulation layer, and configured to electrically connect adjacent light emitting cells in series to form a serial array of light emitting cells; a first pad metal layer electrically connected to the first conductivity type semiconductor layer of a last light emitting cell disposed at a last terminal of the serial array through the opening of the lower insulation layer; a second pad metal layer electrically connected to the ohmic reflection layer of a first light emitting cell disposed at a first terminal of the serial array through the opening of the lower insulation layer; third pad metal layers disposed on the lower insulation layer, and spaced apart from the connectors and the first and second pad metal layers; an upper insulation layer covering the connectors and the first through third pad metal layers, and having openings exposing upper surfaces of the first and second pad metal layers, respectively; and a first bump pad and a second bump pad connected to the upper surfaces of the first pad metal layer and the second pad metal layer exposed by the openings of the upper insulation layer, respectively, in which the third pad metal layers cover cell isolation regions between the light emitting cells, respectively, and are disposed between the connectors electrically connecting adjacent light emitting cells.

A light emitting diode according to another embodiment of the present disclosure includes: a plurality of light emitting cells arranged in one row; ohmic reflection layers disposed on the light emitting cells; connectors electrically connecting adjacent light emitting cells to one another; a bump pad electrically connected to one of the light emitting cells; and a reflection metal layer partially covering a region between adjacent light emitting cells, in which the connectors are arranged along both edges of the light emitting cells, and the reflection metal layer is electrically insulated from the bump pad, and disposed between the connectors disposed on both sides of the light emitting cells.

Advantageous Effects

According to embodiments of the present disclosure, by disposing a third pad metal layer between connectors, a light efficiency of a light emitting diode may be improved by reflecting light in a region between light emitting cells, and in addition, by electrically floating the third pad metal layer, an electrical reliability of the light emitting diode may be improved.

Other advantages and effects of the present disclosure will become more apparent through detailed description.

BEST MODE

Figure 1:
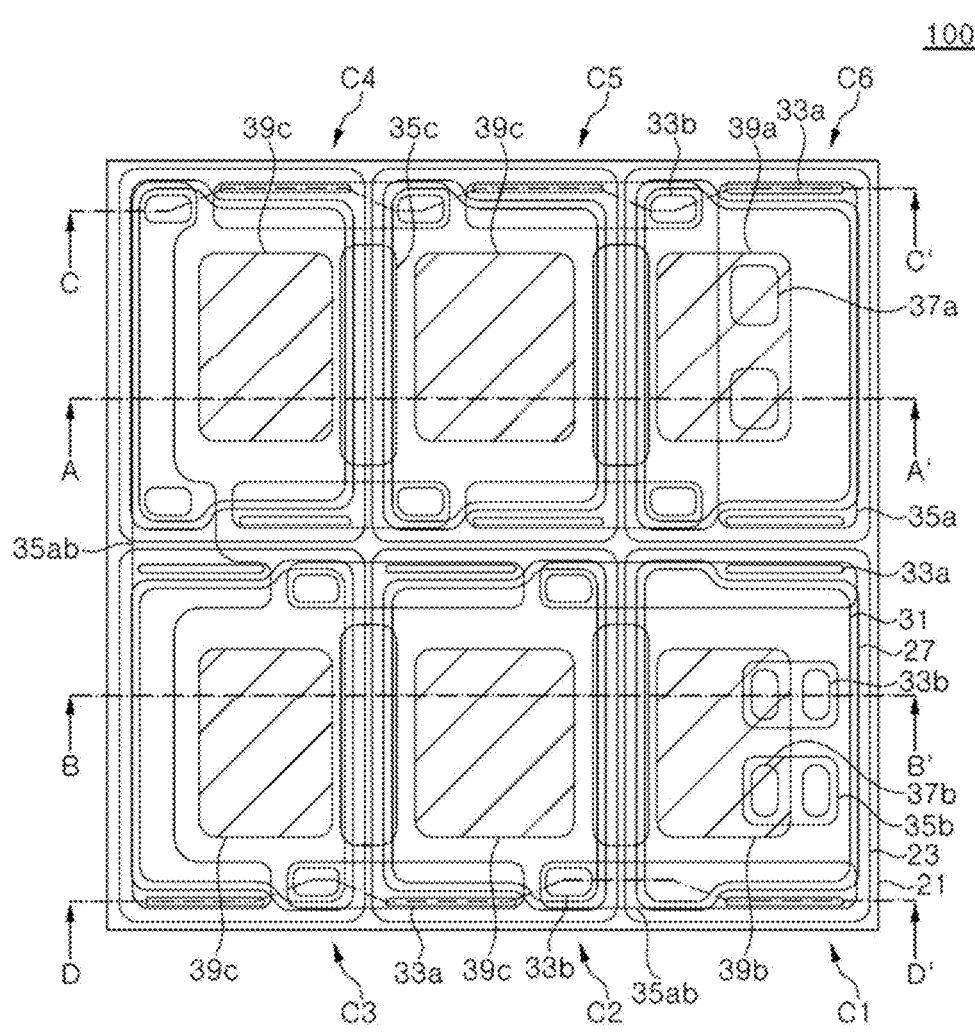
FIG. 1 is a schematic plan view illustrating a light emitting diode according to an embodiment of the present disclosure.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the inventive concepts are not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A light emitting diode according to an embodiment of the present disclosure includes: light emitting cells, each including a first conductivity type semiconductor layer, an active layer, and a second conductivity type semiconductor layer, and arranged in a matrix; an ohmic reflection layer disposed on and in ohmic contact with the second conductivity type semiconductor layer of each of the light emitting cells; a lower insulation layer covering the light emitting cells and the ohmic reflection layers, and having openings exposing the first conductivity type semiconductor layer and the ohmic reflection layer of each of the light emitting cells; connectors disposed on the lower insulation layer, and configured to electrically connect adjacent light emitting cells in series to form a serial array of light emitting cells; a first pad metal layer electrically connected to the first conductivity type semiconductor layer of a last light emitting cell disposed at a last terminal of the serial array through the opening of the lower insulation layer; a second pad metal layer electrically connected to the ohmic reflection layer of a first light emitting cell disposed at a first terminal of the serial array through the opening of the lower insulation layer; third pad metal layers disposed on the lower insulation layer, and spaced apart from the connectors and the first and second pad metal layers; an upper insulation layer covering the connectors and the first through third pad metal layers, and having openings exposing upper surfaces of the first and second pad metal layers, respectively; and a first bump pad and a second bump pad connected to the upper surfaces of the first pad metal layer and the second pad metal layer exposed by the openings of the upper insulation layer, respectively, in which the third pad metal layers cover cell isolation regions between the light emitting cells, respectively, and are disposed between the connectors electrically connecting adjacent light emitting cells.

The third pad metal layers may be spaced apart from the first and second bump pads in a lateral direction so as not to overlap the first and second bump pads.

Furthermore, the third pad metal layers may partially overlap the ohmic reflection layers over the adjacent light emitting cells.

The light emitting diode may further include third bump pads disposed on light emitting cells, respectively, other than the first light emitting cell and the last light emitting cell.

The third pad metal layers may be spaced apart from the third bump pads in a lateral direction so as not to overlap the third bump pads.

In an embodiment, each of the third pad metal layers may be disposed across all light emitting cells in one row, and each of the third bump pads may overlap one of the third pad metal layers.

In an embodiment, the third bump pads may be electrically insulated from the third pad metal layers. In another embodiment, the third bump pads may be connected to the third pad metal layers.

Each of the third pad metal layers may be disposed across all light emitting cells in one row, and each of the first and second bump pads may be disposed across all light emitting cells in one row.

Each of the first and second bump pads may overlap the third pad metal layers, and a region where the first bump pad overlaps the third pad metal layer over the last light emitting cell may be smaller than a region where the first bump pad overlaps the third pad metal layer over another adjacent light emitting cell, and a region where the second bump pad overlaps the third pad metal layer over the first light emitting cell may be smaller than a region where the second bump pad overlaps the third pad metal layer over another adjacent light emitting cell.

The first pad metal layer may be disposed within an upper region of the last light emitting cell, and the second pad metal layer may be disposed within an upper region of the first light emitting cell.

The light emitting cells may include a mesa disposed on the first conductivity type semiconductor layer, the mesa may include the active layer and the second conductivity type semiconductor layer, and the first pad metal layer may cover a portion of a side surface of the mesa of the last light emitting cell.

In an embodiment, the second pad metal layer may be disposed in an upper region of the ohmic reflection layer on the first light emitting cell.

In another embodiment, the second pad metal layer may cover a portion of a side surface of the mesa of the first light emitting cell.

Light emitting cells adjacent to each other in one row among the light emitting cells may be electrically connected to each other by two connectors disposed near both edges of each of the light emitting cells.

Light emitting cells in different rows may be electrically connected to one another by one connector.

The opening of the lower insulation layer exposing the ohmic contact layer and the opening of the upper insulation layer exposing the second pad metal layer may be spaced apart in a lateral direction so as not to overlap each other.

A light emitting diode according to another embodiment of the present disclosure includes: a plurality of light emitting cells arranged in one row; ohmic reflection layers disposed on the light emitting cells; connectors electrically connecting adjacent light emitting cells to one another; a bump pad electrically connected to one of the light emitting cells; and a reflection metal layer partially covering a region between adjacent light emitting cells, in which the connectors are arranged along both edges of the light emitting cells, and the reflection metal layer is electrically insulated from the bump pad, and disposed between the connectors disposed on both sides of the light emitting cells.

The reflection metal layer may partially overlap the ohmic reflection layers on adjacent light emitting cells.

In an embodiment, the reflection metal layer may be spaced apart from the bump pad in a lateral direction so as not to overlap the bump pad.

In another embodiment, the reflection metal layer may overlap the bump pad, and a region where the bump pad and the reflection metal layer overlap on a light emitting cell to which the bump pad is electrically connected may be smaller than a region where the bump pad and the reflection metal layer overlap on another light emitting cell.

Hereinafter, embodiments of the present disclosure will be described in detail with reference to the drawings.

Figure 2A:
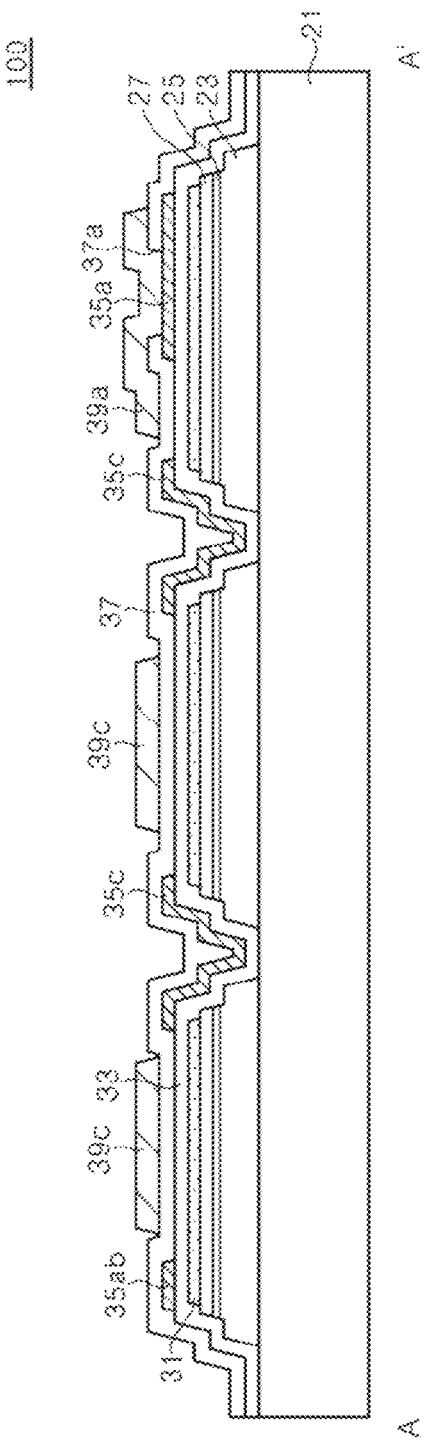
FIG. 2A is a schematic cross-sectional view taken along line A-A' in FIG. 1.
Figure 2B:
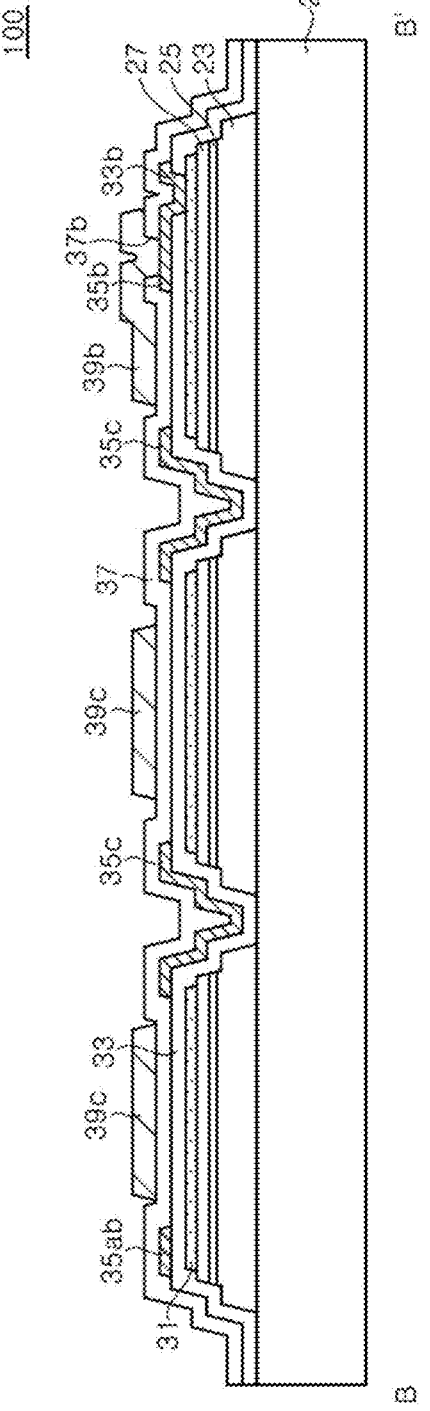
FIG. 2B is a schematic cross-sectional view taken along line B-B' in FIG. 1.
Figure 2C:
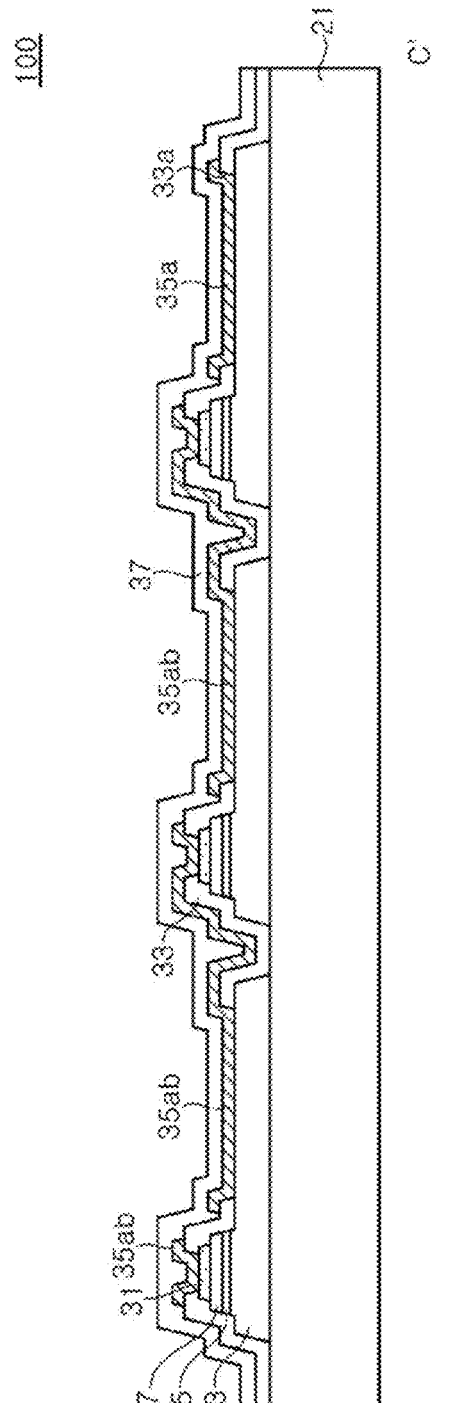
FIG. 2C is a schematic cross-sectional view taken along line C-C' in FIG. 1.
Figure 2D:
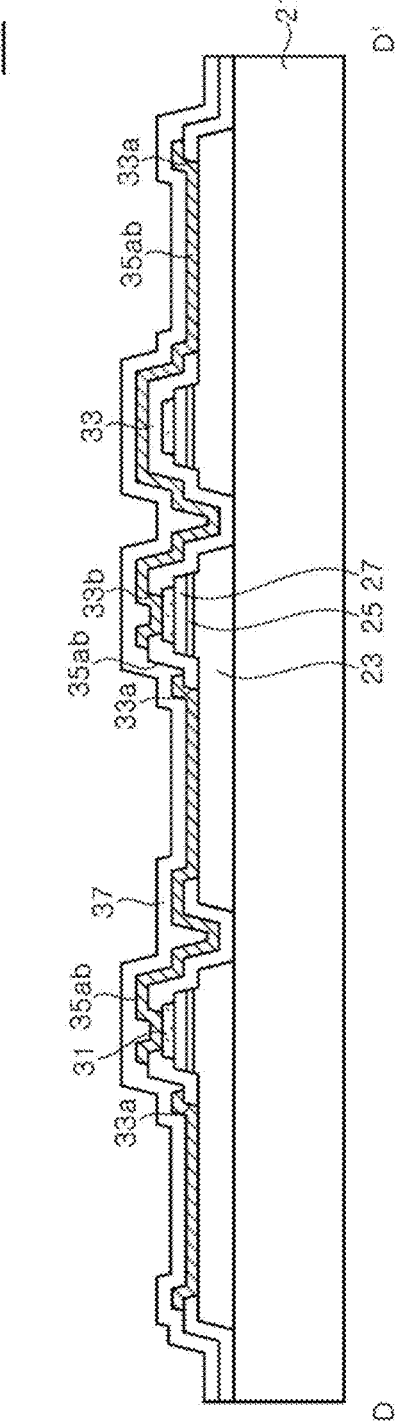
FIG. 2D is a schematic cross-sectional view taken along line D-D' in FIG. 1.

FIG. 1 is a schematic plan view illustrating a light emitting diode according to an embodiment of the present disclosure, FIG. 2A is a schematic cross-sectional view taken along line A-A' in FIG. 1, FIG. 2B is a schematic cross-sectional view taken along line B-B' in FIG. 1, FIG. 2C is a schematic cross-sectional view taken along line C-C' in FIG. 1, and FIG. 2D is a schematic cross-sectional view taken along line D-D' in FIG. 1.

Referring to FIGS. 1, 2A, 2B, 2C, and 2D, the light emitting diode includes a substrate 21, a plurality of light emitting cells C1 through C6, an ohmic reflection layer 31, and a lower insulation layer 33, a first pad metal layer 35a, a second pad metal layer 35b, third pad metal layers 35c, connectors 35ab, an upper insulation layer 37, a first bump pad 39a, a second bump pads 39b, and dummy bumps 39c. Each of the light emitting cells C1 through C6 includes a first conductivity type semiconductor layer 23, an active layer 25, and a second conductivity type semiconductor layer 27.

The substrate 21 is not particularly limited as long as a gallium nitride-based semiconductor layer that can be grown thereon. Examples of the substrate 21 may be various, such as a sapphire substrate, a gallium nitride substrate, a SiC substrate, and the like, and may be a patterned sapphire substrate. As shown in the plan view of FIG. 1, the substrate 21 may have a rectangular or square shape, but is not necessarily limited thereto. A size of the substrate 21 is not particularly limited and may be variously selected.

The plurality of light emitting cells C1 through C6 is disposed apart from one another on the substrate 21. The light emitting cells C1 through C6 may be arranged in a matrix shape. Although six light emitting cells C1 through C6 are shown in this embodiment, the number of light emitting cells may be adjusted.

Each of the light emitting cells C1 through C6 includes the first conductivity type semiconductor layer 23. The first conductivity type semiconductor layer 23 is disposed on the substrate 21. The first conductivity type semiconductor layer 23 is a layer grown on the substrate 21, which may be a gallium nitride-based semiconductor layer doped with an impurity, for example, Si.

The active layer 25 and the second conductivity type semiconductor layer 27 are disposed on the first conductivity type semiconductor layer 23. The active layer 25 is disposed between the first conductivity type semiconductor layer 23 and the second conductivity type semiconductor layer 27. The active layer 25 and the second conductivity type semiconductor layer 27 may have a smaller area than that of the first conductivity type semiconductor layer 23. The active layer 25 and the second conductivity type semiconductor layer 27 may be disposed on the first conductivity type semiconductor layer 23 in a mesa shape formed by mesa etching.

At edges adjacent to an edge of the substrate 21 among edges of the light emitting cells C1 through C6, an edge of the first conductivity type semiconductor layer 23 and a mesa, for example, edges of the active layer 25 and the second conductivity type semiconductor layer 27 may be spaced apart from each another. That is, a portion of an upper surface of the first conductivity type semiconductor layer 23 is exposed to the outside of the mesa. The active layer 25 disposed farther away from the edge of the substrate 21 than the first conductivity type semiconductor layer 23, and thus, it is possible to prevent the active layer 25 from being damaged in a substrate separation process with a laser. Furthermore, a contact region described below may be formed in the first conductivity type semiconductor layer 23 exposed to the outside of the mesa.

A light emitting area of each of the light emitting cells C1 through C6 may be substantially same. Moreover, the light emitting cells C1 through C6 may have substantially similar shapes to one another. Accordingly, the light emitting cells C1 through C6 may be driven under a substantially same current density. However, the inventive concepts are not limited thereto, and the light emitting cells C1 through C6 may have different light emitting areas, or may have different shapes.

The active layer 25 may have a single quantum well structure or a multiple quantum well structure. A composition and a thickness of a well layer in the active layer 25 determines a wavelength of generated light. In particular, by adjusting the composition of the well layer, an active layer generating ultraviolet light, blue light, or green light may be provided.

The second conductivity type semiconductor layer 27 may be a gallium nitride-based semiconductor layer doped with a p-type impurity, for example, Mg. Each of the first conductivity type semiconductor layer 23 and the second conductivity type semiconductor layer 27 may be a single layer, without being limited thereto, and may be multiple layers, or may include a superlattice layer. The first conductivity type semiconductor layer 23, the active layer 25, and the second conductivity type semiconductor layer 27 may be grown on the substrate 21 in a chamber using a known method such as metal organic chemical vapor deposition (MOCVD) or molecular beam epitaxy (MBE).

The ohmic reflection layer 31 is disposed on the second conductivity type semiconductor layer 27, and electrically connected to the second conductivity type semiconductor layer 27. The ohmic reflection layer 31 may be disposed across almost an entire region of the second conductivity type semiconductor layer 27 in an upper region of the second conductivity type semiconductor layer 27. For example, the ohmic reflection layer 31 may cover 80% or more of the upper region of the second conductivity type semiconductor layer 27, further 90% or more. An edge of the ohmic reflection layer 31 may be disposed inside a cell region than the edge of the second conductivity type semiconductor layer 27.

The ohmic reflection layer 31 may include a reflection metal layer, and thus, light generated in the active layer 25 and proceeding to the ohmic reflection layer 31 may be reflected toward the substrate 21. For example, the ohmic reflection layer 31 may be formed of a single reflection metal layer, without being limited thereto, and may include an ohmic layer and a reflection layer. A metallic layer such as Ni or a transparent oxide layer such as ITO may be used as the ohmic layer, and a metallic layer having high reflectivity such as Ag or Al may be used as the reflection layer.

The lower insulation layer 33 covers the light emitting cells C1 through C6 and the ohmic reflection layer 31. The lower insulation layer 33 may cover not only upper surfaces of the light emitting cells C1 through C6 but also may cover side surfaces of the light emitting cells C1 through C6 along a periphery thereof, and may partially cover the substrate 21 around the light emitting cells C1 through C6. The lower insulation layer 33 particularly covers cell isolation regions between the light emitting cells C1 through C6.

Meanwhile, the lower insulation layer 33 has first openings 33a exposing the first conductivity type semiconductor layer and second openings 33b exposing the ohmic reflection layers 31. The first openings 33a expose the first conductivity type semiconductor layer exposed around the mesa on both sides of each of the light emitting cells C1 through C6.

The second openings 33b are disposed on the ohmic reflection layers 31. As shown in FIG. 1, the second openings 33b on remaining light emitting cells C2 through C6 other than a first light emitting cell C1 are formed over the mesa and adjacent to the first openings 33a on the both sides of each of the light emitting cells. In particular, the second openings 33b on the remaining light emitting cells C2 through C6 other than the first light emitting cell C1 may be disposed near the first openings 33a on adjacent light emitting cells. Meanwhile, the second openings 33b on the first light emitting cell C1 may be disposed between the first openings 33a on the first light emitting cell C1. Positions and shapes of the second openings 33b may be variously modified for arrangement and electrical connection of the light emitting cells C1 through C6.

The first openings 33a may have a relatively elongated shape compared to those of the second openings 33a, and the first openings 33a on each of the light emitting cells may be parallel to one another. The first openings 33a may have substantially same sizes as one another. The second openings 33b on the remaining light emitting cells C2 through C6 other than the first light emitting cell C1 may also have substantially same sizes as one another.

The lower insulation layer 33 may be formed of a single layer of $SiO_2$ or $Si_3N_4$, but is not limited thereto. For example, the lower insulation layer 33 may have a multi-layer structure including a silicon nitride film and a silicon oxide film, and may include a distributed Bragg reflector in which layers having different refractive indices such as a $SiO_2$ film, a $TiO_2$ film, a $ZrO_2$ film, a $MgF_2$ film, a $Nb_2O_5$ film, or the like are alternately stacked. In addition, all portions of the lower insulation layer 33 may have a same stacked structure, without being limited thereto, and certain portions may include more layers than other portions. In particular, the lower insulation layer 33 around the ohmic reflection layer 31 may be thicker than the lower insulation layer 33 over the ohmic reflection layer 31.

Figure 3:
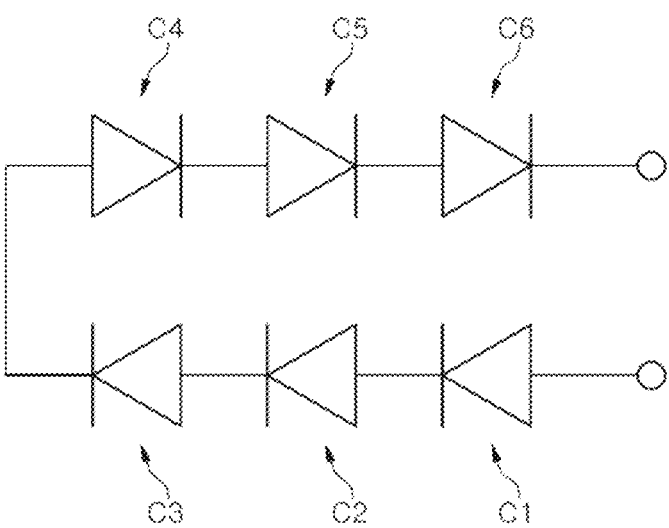
FIG. 3 is a schematic circuit diagram of the light emitting diode of FIG. 1.

The first pad metal layer 35a, the second pad metal layer 35b, the third pad metal layer 35c, and the connectors 35ab are disposed on the lower insulation layer 33. The second pad metal layer 35b is disposed over the first light emitting cell C1, and the first pad metal layer 35a is disposed over a last light emitting cell, that is, a sixth light emitting cell C6. Meanwhile, the connectors 35ab are disposed over two adjacent light emitting cells, and electrically connect the light emitting cells C1 through C6 in series. Accordingly, as shown in FIG. 3, six light emitting cells C1 through C6 of FIG. 1 are connected in series by the connectors 35ab to form a serial array. Herein, the first light emitting cell C1 is disposed at a first terminal of the serial array, and the sixth light emitting cell C6, which is the last light emitting cell, is disposed at a last terminal of the serial array.

Referring back to FIG. 1, the first pad metal layer 35a may be disposed on the last light emitting cell C6. In particular, the first pad metal layer 35a may be disposed within an upper region of the first conductivity type semiconductor layer 23 of the last light emitting cell C6. The first pad metal layer 35a is electrically connected to the first conductivity type semiconductor layer 23 of the last light emitting cell C6 through the first openings 33a of the lower insulation layer 33. The first pad metal layer 35a may directly contact the first conductivity type semiconductor layer 23 through the first openings 33a.

In a case that the first pad metal layer 35a extends to upper regions of adjacent light emitting cells, for example, an upper region of a fifth light emitting cell C5, and further, an upper region of a fourth light emitting cell C4, when driven at a high voltage, a high voltage is applied between the ohmic reflection layers 31 of the fourth and fifth light emitting cells and the first pad metal layer 35a, and accordingly, the lower insulation layer 33 may be broken down, and also, electrical shorts may be induced through defects, such as pinholes or the like. Therefore, the first pad metal layer 35a is disposed within the region of the sixth light emitting cell C6, which improves a reliability of the light emitting diode.

In addition, the second pad metal layer 35b may be disposed within an upper region of the first light emitting cell C1 and further, within the upper region of the second conductivity type semiconductor layer 27 of the first light emitting cell C1. The second pad metal layer 35b is electrically connected to the ohmic reflection layer 31 on the first light emitting cell C1 through the second opening 33b of the lower insulation layer 33. The second pad metal layer 35b may directly contact the ohmic reflection layer 31 through the second opening 33b. In this embodiment, it is shown that two second pad metal layers 35b are spaced apart from each other and connected to the ohmic reflection layer 31 through the second openings 33b, but the inventive concepts are not necessarily limited thereto.

In a case that the second pad metal layer 35b extends to upper regions of adjacent light emitting cells, for example, an upper region of a second light emitting cell C2 and further, an upper region of a third light emitting cell C3, when driven at a high voltage, a high voltage is applied between the ohmic reflection layers 31 of the second and third light emitting cells and the second pad metal layer 35b, and accordingly, the lower insulation layer 33 may be broken down, and also, electrical shorts may be induced through defects, such as pinholes or the like. Therefore, the second pad metal layer 35b is disposed within the region of the first light emitting cell C1, which improves the reliability of the light emitting diode.

Meanwhile, the connectors 35ab electrically connect adjacent light emitting cells to each other. Each of the connectors 35ab is electrically connected to the first conductivity type semiconductor layer 23 of one light emitting cell, as well as the ohmic reflection layer 31 of an adjacent light emitting cell, and thus, the second conductivity type semiconductor layer 27 of the adjacent light emitting cell, such that the connectors 35ab connects the light emitting cells in series. In detail, each of the connectors 35ab may be electrically connected to the first conductivity type semiconductor layer 23 exposed through the first opening 33a of the lower insulation layer 33, and may be electrically connected to the ohmic reflection layer 31 exposed through the second opening 33b. Furthermore, the connectors 35ab may directly contact the first conductivity type semiconductor layer 23 and the ohmic reflection layer 31.

Light emitting cells adjacent to each other in one row may be electrically connected to each other by two connectors 35ab. The two connectors 35ab may be disposed on both sides of the light emitting cells, and may cover adjacent first opening 33a and second opening 33b, respectively. The connectors 35ab may be symmetrically arranged with respect to a plane crossing a center of the light emitting cells C1 through C3 or C4 through C6 arranged in one row. By electrically connecting adjacent light emitting cells using the two connectors 35ab, a reliability of the electrical connection may be improved, and furthermore, current spreading performance may be improved.

Meanwhile, an electrical connection between rows may be carried out by one connector 35ab. For example, the third light emitting cell C3 and the fourth light emitting cell C4 may be connected to each other by one connector 35ab.

Unlike the first and second pad metal layers 35a and 35b and the connectors 35ab, the third pad metal layer 35c is insulated from the light emitting cells C1 through C6 and the ohmic reflection layer 31 by the lower insulation layer 33. In addition, the third pad metal layer is spaced apart from the first and second pad metal layers 35a and 35b and the connectors 35ab. The third pad metal layer 35c is electrically floating. That is, the third pad metal layer 35c is insulated from a conductive element in a light emitting diode 100.

The third pad metal layer 35c is disposed between adjacent light emitting cells. The third pad metal layer 35c is disposed between two connectors 35ab electrically connecting adjacent light emitting cells, and covers a cell isolation region between adjacent light emitting cells. The third pad metal layer 35c may partially cover the ohmic reflection layers 31 on adjacent light emitting cells. The third pad metal layer 35c may have an elongated shape along the cell isolation region. For example, the third pad metal layer 35c may have a length exceeding ½ of a length of an isolation region between adjacent light emitting cells. In this embodiment, the third pad metal layer 35c is shown and described as being disposed between adjacent light emitting cells in each row, but may also be disposed between adjacent light emitting cells between adjacent rows.

The third pad metal layer 35c improves light efficiency of the light emitting diode by reflecting light emitted to a region between adjacent light emitting cells. Furthermore, by electrically floating the third pad metal layers 35c, an electrical short circuit that may occur due to the employment of the third pad metal layer 35c may be prevented.

The first pad metal layer 35a, the second pad metal layer 35b, the third pad metal layer 35c, and the connectors 35ab may be formed together of a same material in a same process after the lower insulation layer 33 is formed, and thus, may be disposed on a same level. However, the inventive concepts are not necessarily limited thereto, and the third pad metal layer 35c may be formed of a material different from those of the first and second pad metal layers 35a and 35b or the connectors 35ab by a different process. In addition, although the inventive concepts are not necessarily limited thereto, each of the first pad metal layer 35a, the second pad metal layer 35b, the third pad metal layer 35c, and the connectors 35ab may include a portion that is disposed on the lower insulation layer 33. In particular, all of the third pad metal layers 35c are disposed on the lower insulation layer 33 to be spaced apart from the light emitting cells and the ohmic reflection layer 31.

Meanwhile, the first, second, and third pad metal layers 35a, 35b, and 35c and the connector 35ab may include a reflection layer such as Al, Ag, Au, Pt, Ni, and the like, and the reflection layer may be formed on an adhesive layer, such as Ti, Cr, Ni, or the like. In addition, a protection layer having a single-layer or multi-layer structure of Ni, Cr, Au, or the like may be formed on the reflection layer.

The upper insulation layer 37 covers the first, second, and third pad metal layers 35a, 35b, and 35c and the connectors 35ab. In addition, the upper insulation layer 37 may cover the lower insulation layer 33 along a periphery of the light emitting cells C1 through C6.

The upper insulation layer 37 has a first opening 37a exposing the first pad metal layer 35a and a second opening 37b exposing the second pad metal layer 35b. The first opening 37a and the second opening 37b are disposed in the upper regions of the last light emitting cell C6 and the first light emitting cell C1, respectively. Except for the first and second openings 37a and 37b, all other regions of the light emitting cells C1 through C6 may be covered with the upper insulation layer 37. Accordingly, both upper surfaces and side surfaces of the connectors 35ab and the third pad metal layers 35c may be covered with the upper insulation layer 37 and sealed.

Meanwhile, in an embodiment, the second opening 37b of the upper insulation layer 37 may be laterally spaced apart so as not to overlap the second opening 33b of the lower insulation layer 33 as shown in FIG. 1. Accordingly, even when solder infiltrates through the second opening 37b of the upper insulation layer 37, it is possible to prevent diffusion of the solder into the second opening 33b of the lower insulation layer 33, thereby preventing a contamination of the ohmic reflection layer 31 by the solder. However, the inventive concepts are not limited thereto, and the second opening 37b of the upper insulation layer 37 may overlap the second opening 33b of the lower insulation layer 33.

The upper insulation layer 37 may be formed of a single layer of $SiO_2$ or $Si_3N_4$, but is not limited thereto. For example, the upper insulation layer 37 may have a multi-layer structure including a silicon nitride film and a silicon oxide film, and may include a distributed Bragg reflector in which layers having different refractive indices such as a $SiO_2$ film, a $TiO_2$ film, a $ZrO_2$ film, a $MgF_2$ film, a $Nb_2O_5$ film, or the like are alternately stacked.

The first bump pads 39a, the second bump pads 39b, and the third bump pads 39c are disposed on the upper insulation layer 37. The first bump pad 39a is disposed on the last light emitting cell, that is, the sixth light emitting cell C6, the second bump pad 39b is disposed on the first light emitting cell C1, and the third bump pads 39b are disposed on middle light emitting cells, for example, the second through fifth light emitting cells C2 through C5, respectively.

The first bump pad 39a may be electrically connected to the first pad metal layer 35a exposed through the first opening 37a of the upper insulation layer 37. The first bump pads 39a may cover all of the first openings 37a of the upper insulation layer 37 and seal them. The first bump pad 39a is disposed in the upper region of the sixth light emitting cell C6, and laterally spaced apart from the third pad metal layer 35c so as not to overlap the third pad metal layer 35c. Furthermore, the first bump pads 39a may be laterally spaced apart from the connectors 35ab.

The second bump pad 39b is electrically connected to the second pad metal layer 35b exposed through the second opening 37b. The second bump pad 39b may cover all of the second openings 37b of the upper insulation layer 37 and seal them. The second bump pad 39b is disposed in the upper region of the first light emitting cell C1, and laterally spaced apart from the third pad metal layer 35c so as not to overlap the third pad metal layer 35c. Furthermore, the second bump pads 39b may be laterally spaced apart from the connectors 35ab.

The first bump pad 39a and the second bump pad 39b are portions that are bonded when the light emitting diode is mounted on a submount or printed circuit board, which are formed of a material suitable for bonding. For example, the first and second bump pads 39a and 39b may include an Au layer or an AuSn layer.

The third bump pads 39c may be disposed on the second through fifth light emitting cells C2 through C5 for stable mounting of the light emitting diodes. Furthermore, the third bump pads 39c may dissipate heat generated from the second through fifth light emitting cells C2 through C5. The third bump pads 39c may be formed together of a same material as those of the first and second bump pads 39a and 39b.

The third bump pads 39c may be electrically insulated from the first and second bump pads 39a and 39b. The third bump pads 39c may be disposed in the upper regions of the second through fifth light emitting cells C2 through C5, respectively, and may be laterally spaced apart from the third pad metal layers 35c. Furthermore, the third bump pads 39c may be laterally spaced apart from the connectors 35ab so as not to overlap the connectors 35ab. Accordingly, it is possible to prevent the third bump pads 39c from being electrically shorted with the connectors 35ab.

According to this embodiment, by employing the third pad metal layers 35c that do not contribute to electrical connection, it is possible to provide the light emitting diode that is configured to improve light efficiency without causing the electrical short. Furthermore, since the first and second bump pads 39a and 39b are laterally spaced apart from the connectors 35ab and the third pad metal layers 35c, electrical reliability is further improved.

In addition, by disposing the third bump pads 39c on the second through fifth light emitting cells C2 through C5, heat generated from the light emitting cells C2 through C5 may be dissipated using the third bump pads 39c, thereby improving heat dissipation performance of the light emitting diode 100.

Although the light emitting diode 100 having six light emitting cells C1 through C6 has been described in this embodiment, the number of light emitting cells may be more or less than six.

A structure of the light emitting diode has been described above in detail, and will be more clearly understood through a method of manufacturing the light emitting diode described below.

FIGS. 4A, 5A, 6A, 7A, and 8A are schematic plan views illustrating a method of manufacturing a light emitting diode according to an embodiment of the present disclosure, and FIGS. 4B, 5B, 6B, 7B, and 8B are schematic cross-sectional views taken along line A-A' of their corresponding plan views shown in FIGS. 4A, 5A, 6A, 7A, and 8A, respectively.

Figure 4A:
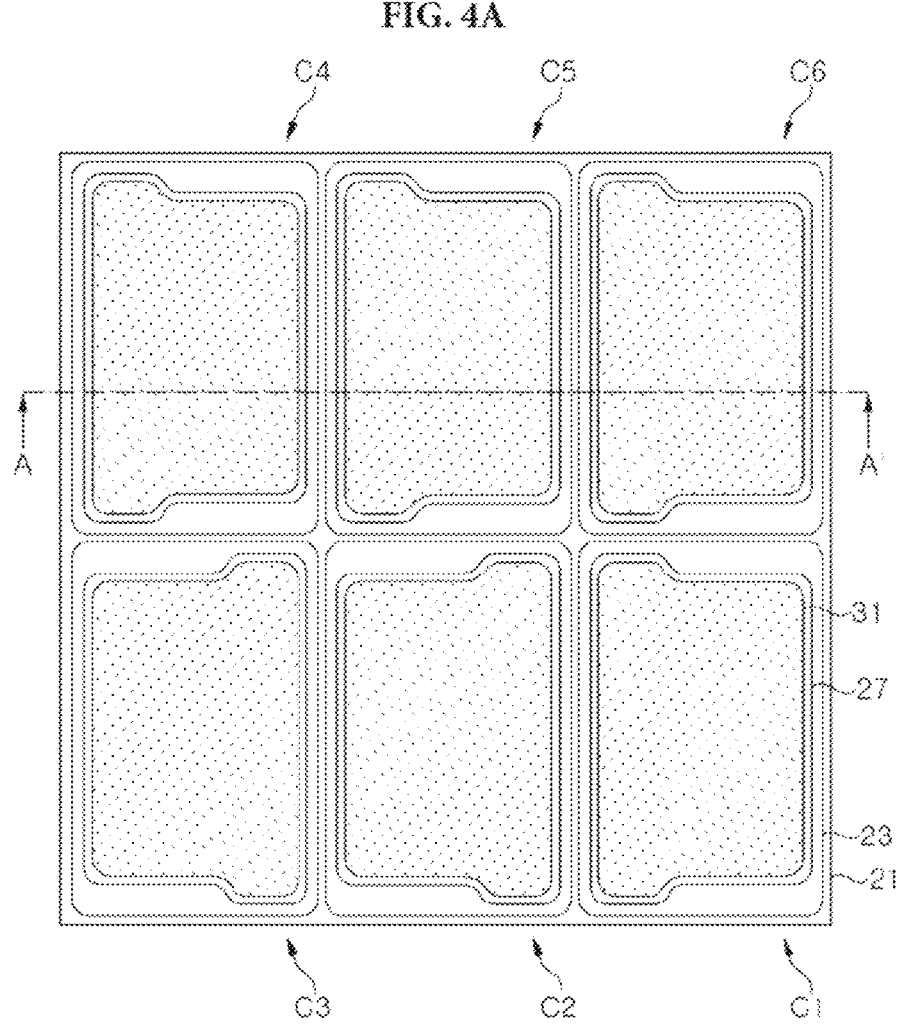
FIGS. 4A, 5A, 6A, 7A, and 8A are schematic plan views illustrating a method of manufacturing a light emitting diode according to an embodiment of the present disclosure.
Figure 4B:
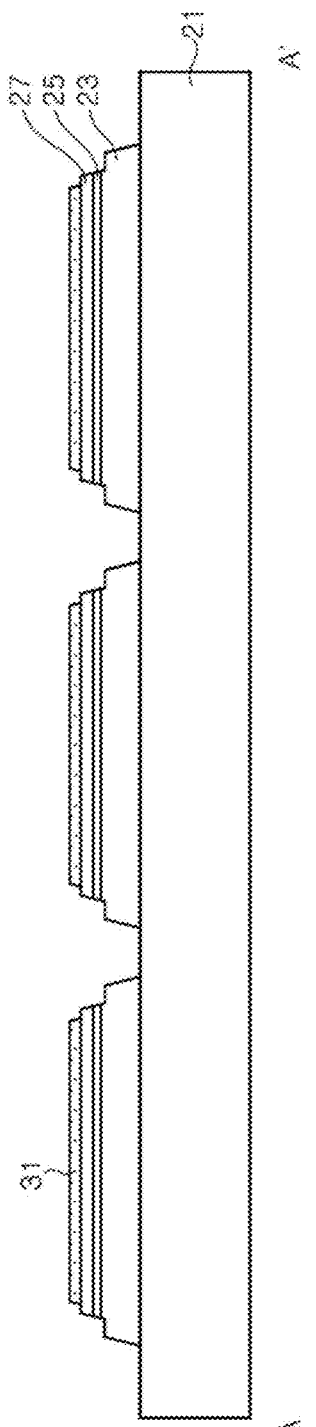
FIGS. 4B, 5B, 6B, 7B, and 8B are schematic cross-sectional views taken along line A-A' of their corresponding plan views shown in FIGS. 4A, 5A, 6A, 7A, and 8A, respectively.

First, referring to FIGS. 4A and 4B, a semiconductor stack including a first conductivity type semiconductor layer 23, an active layer 25, and a second conductivity type semiconductor layer 27 is grown on a substrate 21. The substrate 21 is a substrate on which a gallium nitride-based semiconductor layer can be grown, and may be, for example, a sapphire substrate, a silicon carbide substrate, a gallium nitride (GaN) substrate, or a spinel substrate. In particular, the substrate may be a patterned substrate such as a patterned sapphire substrate.

The first conductivity type semiconductor layer 23 may include, for example, an n-type gallium nitride layer, and the second conductivity type semiconductor layer 27 may include a p-type gallium nitride layer. In addition, the active layer 25 may have a single quantum well structure or a multi-quantum well structure, and may include a well layer and a barrier layer. In addition, composition elements of the well layer may be selected according to a wavelength of desired light, and may include, for example, AlGaN, GaN, or InGaN.

Subsequently, a plurality of light emitting cells C1 through C6 is formed by patterning the semiconductor stack. For example, a mesa formation process for exposing an upper surface of the first conductivity type semiconductor layer 23 and a cell isolation process for forming a cell isolation region may be performed using photolithography and etching processes. The light emitting cells C1 through C6 are spaced apart from one another by the cell isolation region, and may be arranged in a matrix form on the substrate 21.

The upper surface of the first conductivity type semiconductor layer 23 of each of the light emitting cells is exposed by a mesa etching process. The upper surface of the first conductivity type semiconductor layer 23 may be exposed along a periphery of the mesa. The mesa may be substantially formed in a T shape such that the first conductivity type semiconductor layer 23 is relatively widely exposed on both sides of the mesa.

Meanwhile, an ohmic reflection layer 31 is formed on each of the light emitting cells C1 through C6. The ohmic reflection layer 31 may be formed using, for example, a lift-off technique. The ohmic reflection layer 31 may be formed of a single layer or multiple layers, and may include, for example, an ohmic layer and a reflection layer. These layers may be formed using e-beam evaporation, for example. Before the ohmic reflection layer 31 is formed, a preliminary insulation layer (not shown) having an opening may be first formed in a region where the ohmic reflection layer 31 is to be formed.

In this embodiment, it is described that the ohmic reflection layer 31 is formed after the light emitting cells C1 through C6 are formed, but it is not limited thereto. For example, the ohmic reflection layer 31 may be formed first, and then the light emitting cells C1 through C6 may be formed, alternatively, after a metallic layer for the ohmic reflection layer 31 is deposited on the semiconductor stack, the metallic layer and the semiconductor stack may be patterned together and the ohmic reflection layer 31 and the light emitting cells C1 through C6 may be formed together.

Figure 5A:
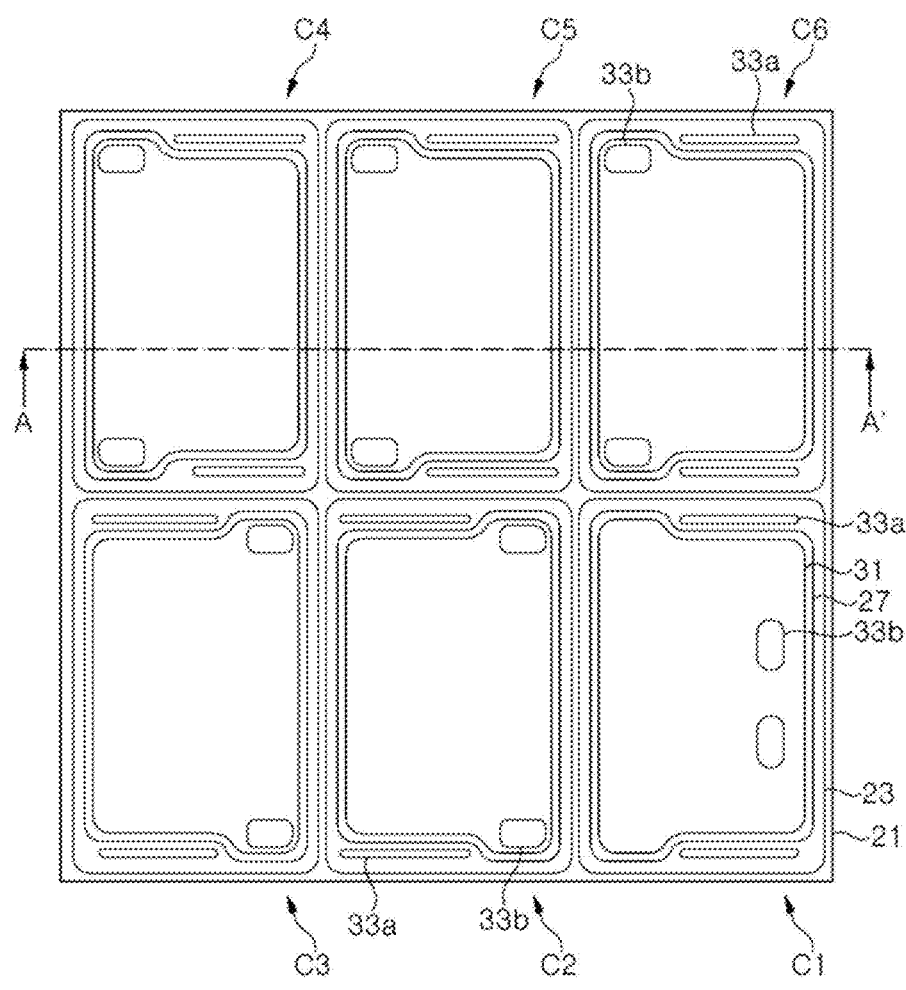
Figure 5B:
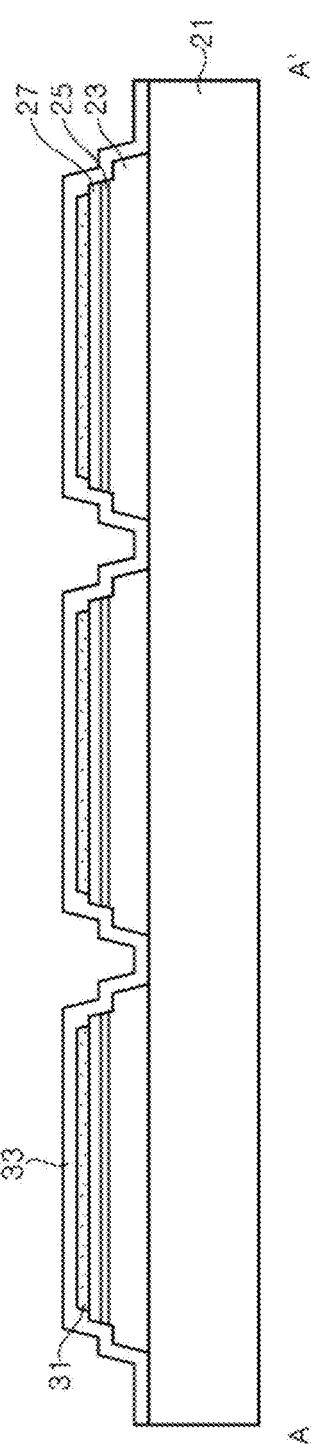

Referring to FIGS. 5A and 5B, a lower insulation layer 33 covering the ohmic reflection layer 31 and the light emitting cells C1 through C6 is formed. The lower insulation layer 33 is formed of an oxide film such as $SiO_2$, a nitride film such as SiNx, or an insulation film of $MgF_2$ using a technique such as chemical vapor deposition (CVD). The lower insulation layer 33 may be formed of a single layer, without being limited thereto, and may be formed of multiple layers. Furthermore, the lower insulation layer 33 may be formed of a distributed Bragg reflector (DBR) in which low refractive index material layers and high refractive index material layers are alternately stacked. For example, an insulating reflection layer having a high reflectance may be formed by stacking layers, such as $SiO_2/TiO_2$, $SiO_2/Nb_2O_5$, $SiO_2/ZrO_2$, $MgF_2/TiO_2$, or the like. The above described preliminary insulation layer (not shown) may be integrated with the lower insulation layer 33. Accordingly, due to the preliminary insulation layer formed around the ohmic reflection layer 31, a thickness of the lower insulation layer 33 may vary depending on a position. That is, the lower insulation layer 33 on the ohmic reflection layer 31 may be thinner than the lower insulation layer 33 around the ohmic reflection layer 31.

The lower insulation layer 33 may be patterned through photolithography and etching processes, and thus, first openings 33a exposing the first conductivity type semiconductor layer 23 and second openings 33b exposing the ohmic reflection layer 31 may be formed. The first openings 33a may expose the first conductivity type semiconductor layer 23 around the mesa, and the second openings 33b may expose the ohmic reflection layer 31 on each of the light emitting cells.

Figure 6A:
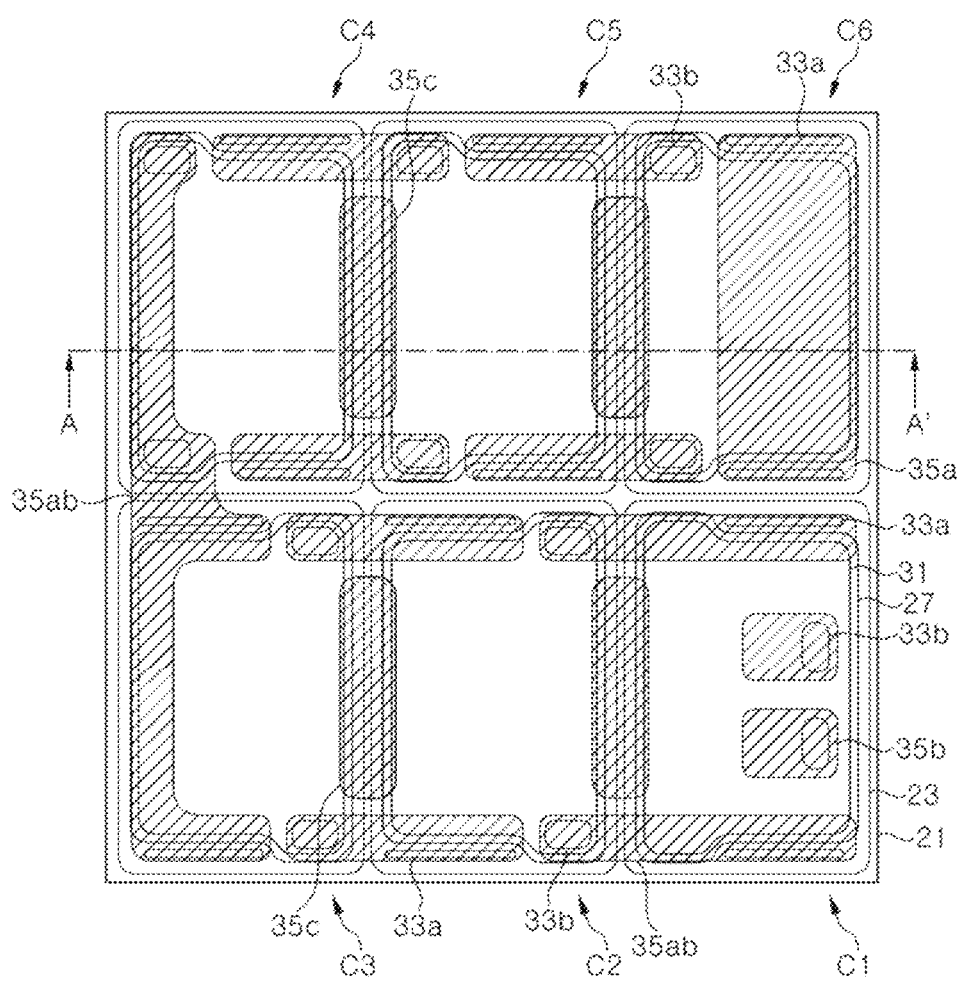
Figure 6B:
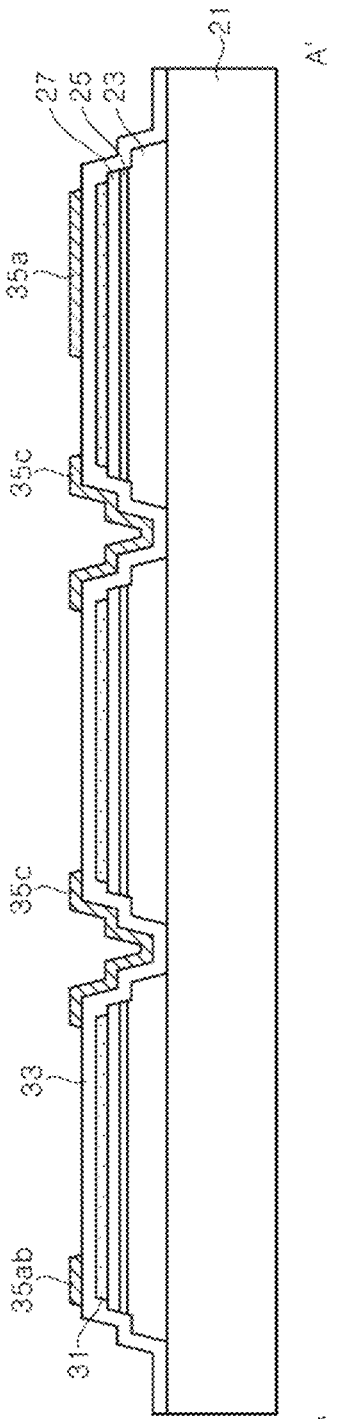

Referring to FIGS. 6A and 6B, a first pad metal layer 35a, a second pad metal layer 35b, a third pad metal layer 35c, and connectors 35ab are formed on the lower insulation layer 33.

The connectors 35ab electrically connect a first light emitting cell C1 through sixth light emitting cell C6 to form a serial array of the light emitting cells C1 through C6. The first light emitting cell C1 is disposed at a first terminal of the serial array, and the sixth light emitting cell C6 is disposed at a last terminal of the serial array.

Each of the connectors 35ab electrically connects the first conductivity type semiconductor layer 23 of one light emitting cell and the second conductivity type semiconductor layer 27 of the light emitting cell adjacent thereto. Adjacent light emitting cells in one row, for example, each of first through third light emitting cells C1 through C3 or fourth through sixth light emitting cells C4 through C6 may be electrically connected to each other through two connectors 35ab. In addition, adjacent light emitting cells between adjacent rows, for example, the third light emitting cell C3 and the fourth light emitting cell C4 may be electrically connected to each other by one connector 35ab.

The connectors 35ab may be disposed near both sides of each of the light emitting cells C1 through C6, and pass through the cell isolation region so as to connect adjacent light emitting cells. The connectors 35ab may be electrically connected to the first conductivity type semiconductor layer 23 and the ohmic reflection layer 31 through the first openings 33a and the second openings 33b of the lower insulation layer.

Meanwhile, the first pad metal layer 35a is disposed on a last light emitting cell C6 disposed at the last terminal of the serial array of light emitting cells, and the second pad metal layer 35b is disposed on the first light emitting cell C1 disposed at the first terminal. The first pad metal layer 35a may be disposed within an upper region of the first conductivity type semiconductor layer 23 of the last light emitting cell C6, and the second pad metal layer 35b may be disposed within an upper region of the ohmic reflection layer 31 of the first light emitting cell C1. However, the inventive concepts are not limited thereto, and the first pad metal layer 35a may extend to a side surface of the first conductivity type semiconductor layer 23, and further, may extend to an upper surface of the substrate 21. In addition, the second pad metal layer 35b may extend to an upper surface of the first conductivity type semiconductor layer 23, and further, may extend to the upper surface of the substrate 21.

The first pad metal layer 35a is electrically connected to the first conductivity type semiconductor layer 23 through the first opening 33a of the lower insulation layer 33 on the last light emitting cell C6. The first pad metal layer 35a may directly contact the first conductivity type semiconductor layer 23. Accordingly, the first pad metal layer 35a may include an ohmic layer in ohmic contact with the first conductivity type semiconductor layer 23.

Meanwhile, the second pad metal layer 35*b* is electrically connected to the ohmic reflection layer 31 through the second opening 33*b* of the lower insulation layer 33 on the first light emitting cell C1. The second pad metal layer 35*b* may directly contact the ohmic reflection layer 31.

The third pad metal layers 35*c* may partially cover regions between adjacent light emitting cells. The third pad metal layers 35*c* are electrically insulated from the first and second pad metal layers 35*a* and 35*b* and the connectors 35*c*. The third pad metal layers 35*c* may partially cover the ohmic reflection layers 31 disposed on adjacent light emitting cells.

The first pad metal layer 35*a*, the second pad metal layer 35*b*, the third pad metal layer 35*c*, and the connectors 35*ab* may be formed of a same material in a same process. For example, the first pad metal layer 35*a*, the second pad metal layer 35*b*, the third pad metal layer 35*c*, and the connectors 35*ab* may include Ti, Cr, Ni, or the like as an adhesive layer, and may include Al, Ag, Au, Pt, or the like as a metal reflection layer. Furthermore, the first pad metal layer 35*a*, the second pad metal layer 35*b*, the third pad metal layer 35*c*, and the connectors 35*ab* may further include an anti-diffusion layer for preventing diffusion of a metallic element such as Sn and an anti-oxidation layer for preventing oxidation of the anti-diffusion layer. For example, Cr, Ti, Ni, Mo, TiW, W, or the like may be used as the anti-diffusion layer, and Au may be used as the anti-oxidation layer.

In this embodiment, the process may be simplified by forming the first pad metal layer 35*a*, the second pad metal layer 35*b*, the third pad metal layer 35*c*, and the connectors 35*ab* together in the same process. However, the inventive concepts are not limited thereto, and the third pad metal layer 35*c* may be formed on the lower insulation layer 33 in a separate process.

Figure 7A:
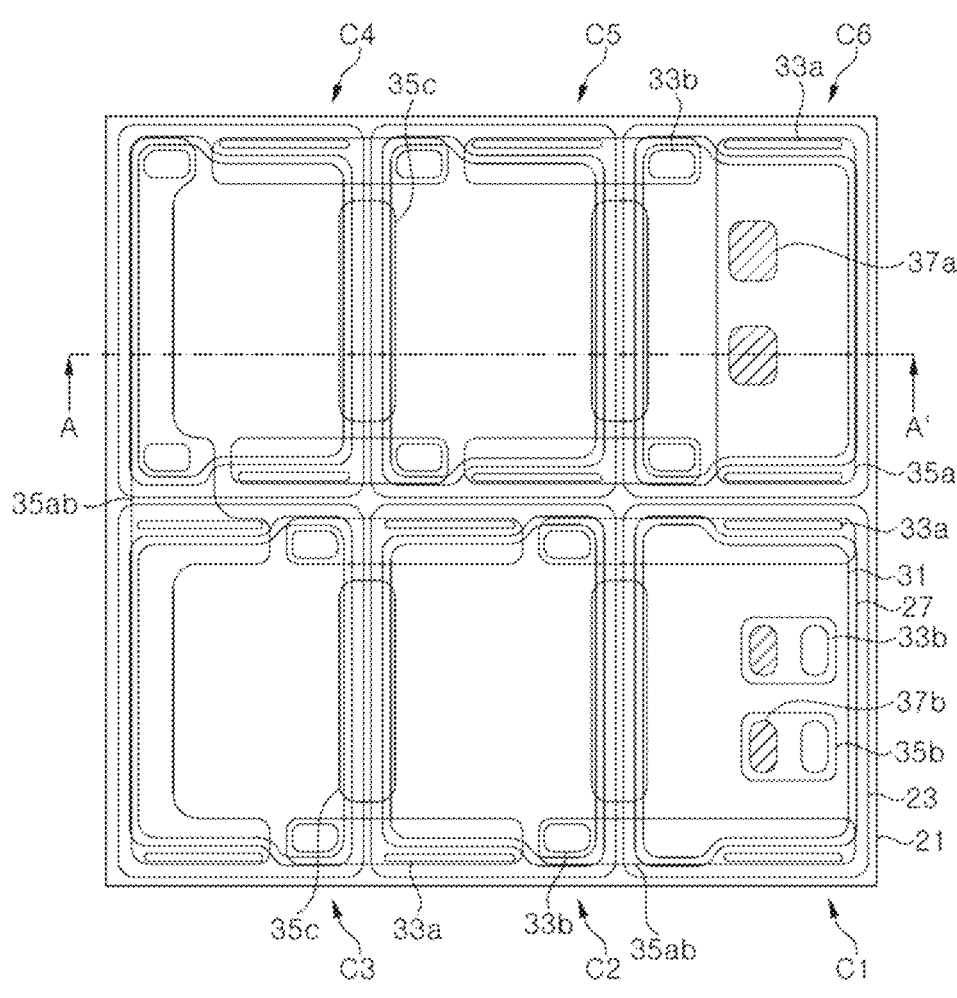
Figure 7B:
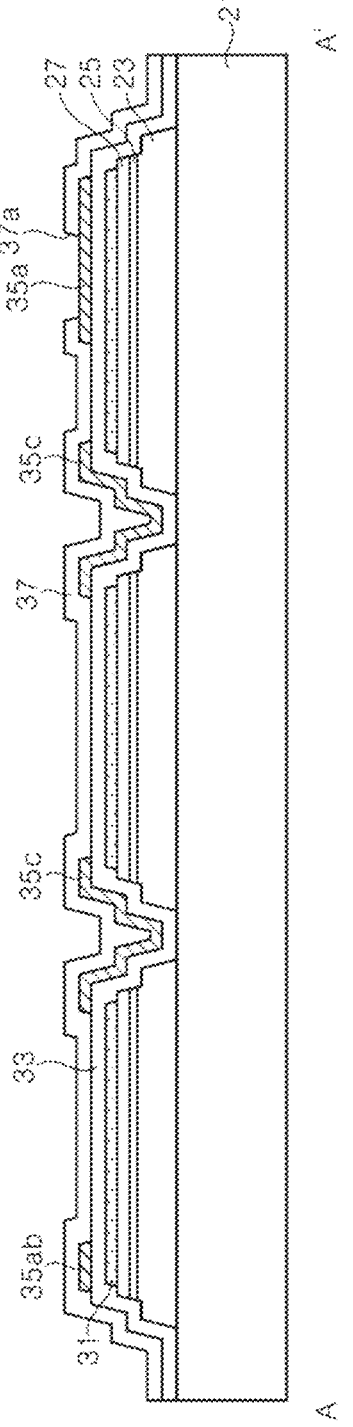

Referring to FIGS. 7A and 7B, an upper insulation layer 37 covering the first pad metal layer 35*a*, the second pad metal layer 35*b*, the third pad metal layer 35*c*, and the connectors 35*ab* is formed. The upper insulation layer 37 may have openings 37*a* exposing the first pad metal layer 35*a* and openings 37*b* exposing the second pad metal layer 35*b*. The openings 37*a* and 37*b* may be disposed within upper portions of the first pad metal layer 35*a* and the second pad metal layer 35*b*, respectively.

In this embodiment, two first openings 37*a* are shown, without being limited thereto, and one or more than three openings 37*a* may be used. Also, although two second openings 37*b* are shown, one or three or more openings 37*b* may be formed.

Meanwhile, the opening 37*b* of the upper insulation layer 37 may be laterally spaced apart from the second opening 33*b* of the lower insulation layer 33. By disposing the opening 37*b* of the upper insulation layer 37 apart from the second opening 33*b* of the lower insulation layer 33 so as not to overlap each other, contamination of the ohmic reflection layer 31 by solder or the like may be prevented. However, the inventive concepts are not limited thereto, and the second opening 33*b* of the lower insulation layer 33 and the opening 37*b* of the upper insulation layer 37 may overlap each other.

The upper insulation layer 37 may be formed of a silicon oxide film or a silicon nitride film, and further, may be formed of a distributed Bragg reflector.

Figure 8A:
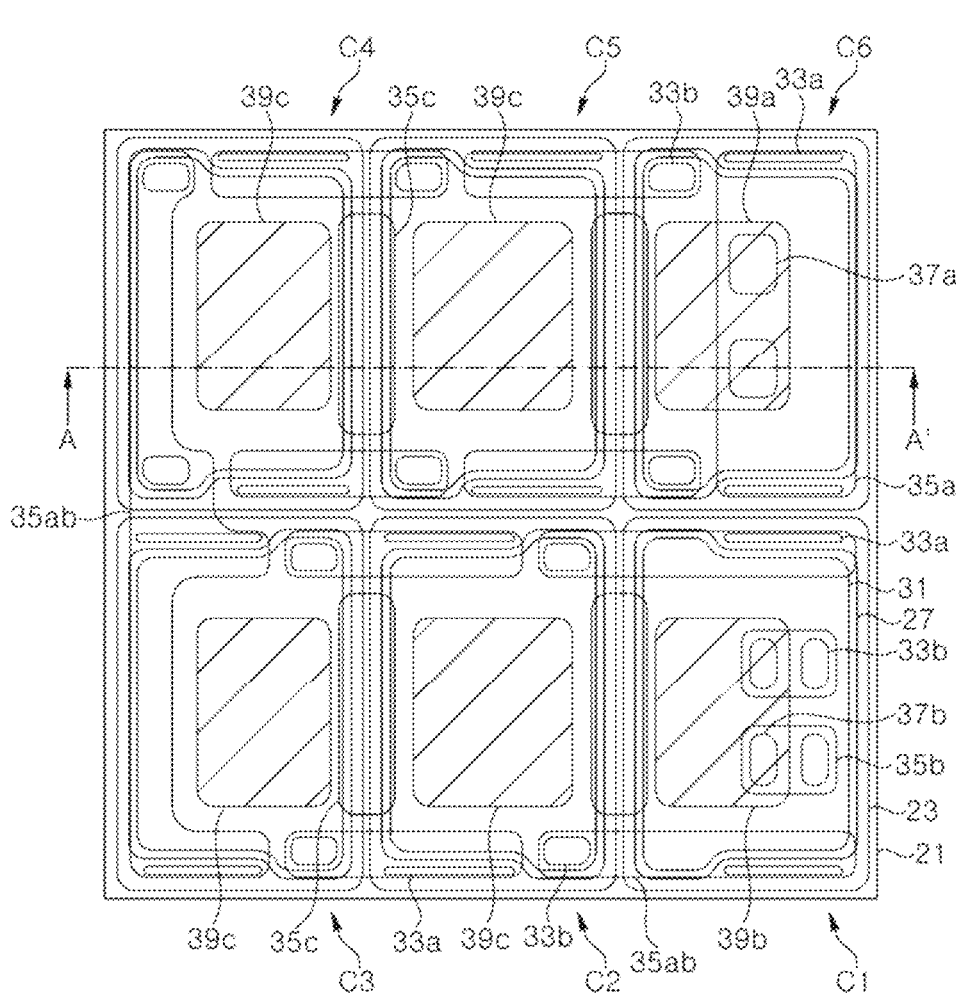
Figure 8B:
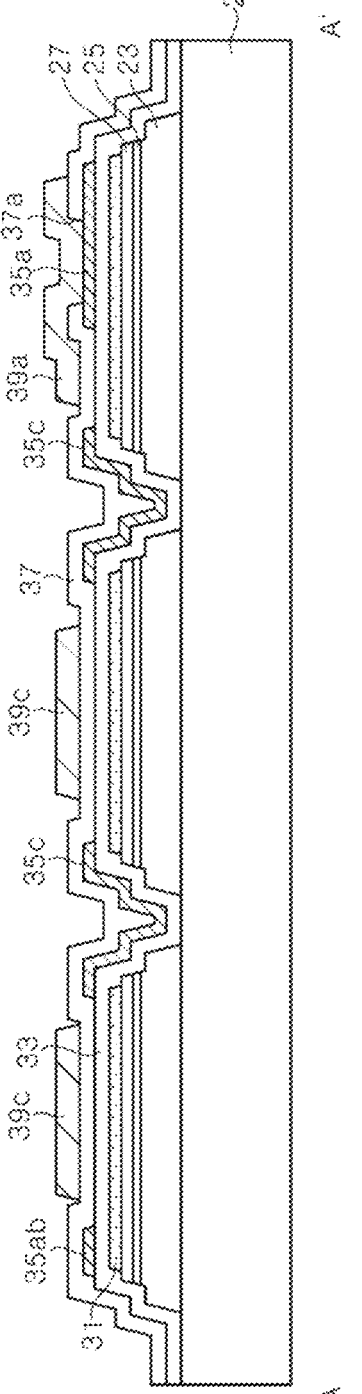

Referring to FIGS. 8A and 8B, a first bump pad 39*a*, a second bump pad 39*b*, and third bump pads 39*c* are formed on the upper insulation layer 37.

The first bump pad 39*a* is electrically connected to the first pad metal layer 35*a* through the opening 37*a* of the upper insulation layer 37, and the second bump pad 39*b* is electrically connected to the second pad metal layer 35*b* through the opening 37*b* of the upper insulation layer 37.

The first bump pad 39*a* may be limitedly disposed on the last light emitting cell, for example, the sixth light emitting cell C6. The first bump pad 39*a* may partially overlap the first pad metal layer 35*a*, and is laterally spaced apart from the connectors 35*ab* and the third pad metal layer 35*c* so as not to overlap them.

The second bump pad 39*b* may be limitedly disposed on the first light emitting cell C1. The second bump pad 39*b* may partially overlap the second pad metal layer 35*b*, and is laterally spaced apart from the connectors 35*ab* and the third pad metal layer 35*c* so as not to overlap them.

The third bump pads 39*c* may be disposed on the second through fifth light emitting cells C2 through C5, respectively. The third bump pads 39*c* are spaced apart from the first and second bump pads 39*a* and 39*b*, and laterally spaced apart from the first through third pad metal layers 35*a*, 35*b*, and 35*c* and the connectors 35*ab*.

After the first, second, and third bump pads 39*a*, 39*b*, and 39*c* are formed, a lower surface of the substrate 21 may be partially removed through a grinding and/or lapping process to reduce a thickness of the substrate 21. Subsequently, by dividing the substrate 21 into individual chip units, light emitting diodes isolated from one another are provided. The substrate 21 may be isolated using a laser scribing technique.

Figure 9:
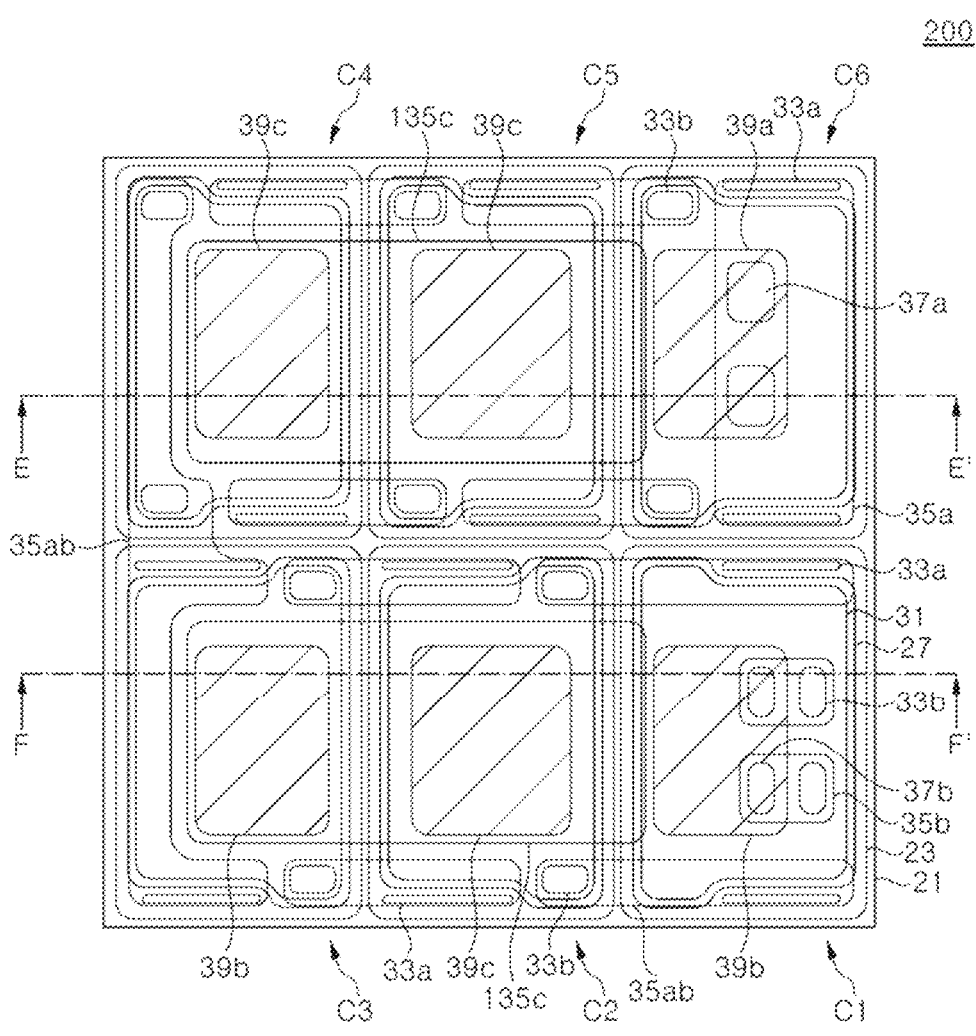
FIG. 9 is a schematic plan view illustrating a light emitting diode according to another embodiment of the present disclosure.
Figure 10A:
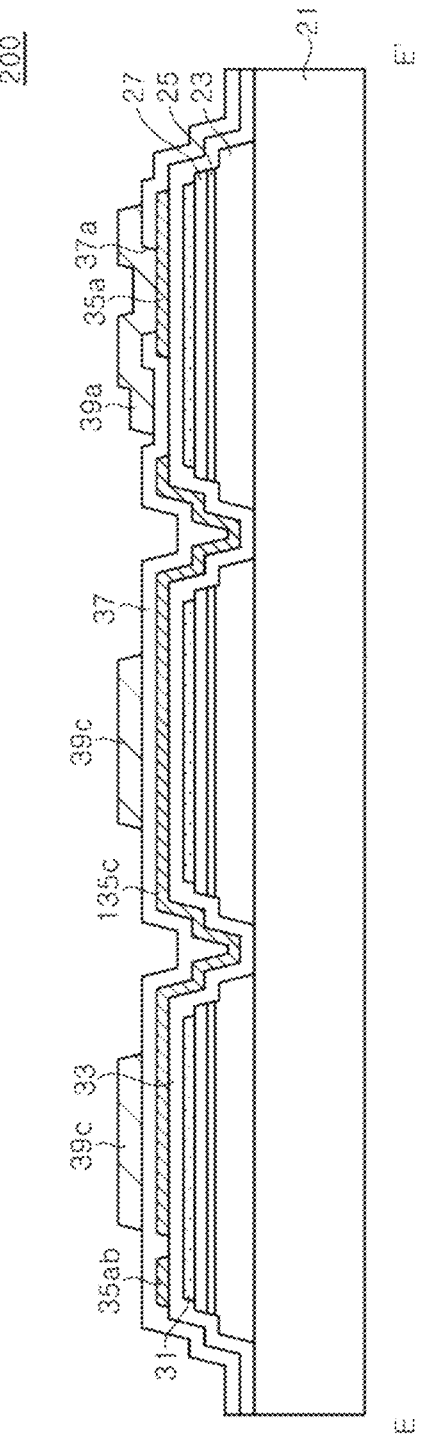
FIG. 10A is a schematic cross-sectional view taken along line E-E' in FIG. 9.
Figure 10B:
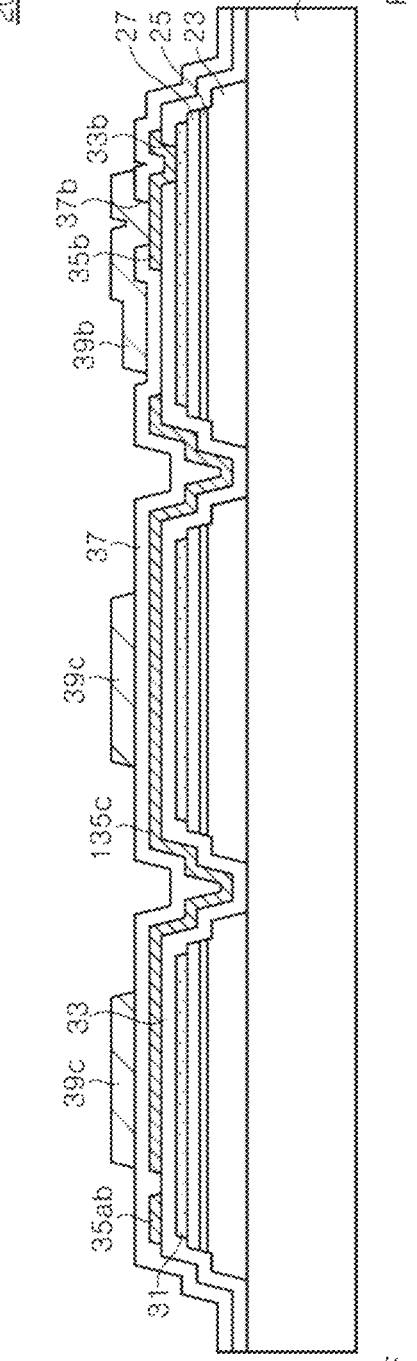
FIG. 10B is a schematic cross-sectional view taken along line F-F' in FIG. 9.

FIG. 9 is a schematic plan view illustrating a light emitting diode 200 according to another embodiment of the present disclosure, FIG. 10A is a schematic cross-sectional view taken along line E-E' in FIG. 9, and FIG. 10B is a schematic cross-sectional view taken along line F-F' in FIG. 9.

Referring to FIGS. 9, 10A, and 10B, the light emitting diode 200 according to this embodiment is generally similar to the light emitting diode 100 of the above-described embodiment, except that a shape and an arrangement position of third pad metal layers 135*c* are different from a shape and an arrangement position of the third pad metal layers 35*c*.

That is, one third pad metal layer 135*c* is disposed in an elongated shape across a plurality of light emitting cells in one row. Similar to the third pad metal layer 35*c* described above, one of the third pad metal layers 135*c* partially overlaps the ohmic reflection layer 31 of the first light emitting cell C1, and extends to the upper regions of the second light emitting cell C2 and the third light emitting cell C3. Another one of the third pad metal layers 135*c* partially overlaps the ohmic reflection layer 31 of the sixth light emitting cell C6, and extends to the upper regions of the fifth light emitting cell C5 and the fourth light emitting cell C4.

The third pad metal layers 135*c* are laterally spaced apart from the first bump pads 39*a* and the second bump pads 39*b*, and thus, an electrical short between the first and second bump pads 39*a* and 39*b* is prevented from occurring.

Meanwhile, since the third bump pads 39*c* are electrically spaced apart from the first and second bump pads 39*a* and 39*b*, even when the third bump pads 39*c* are electrically shorted to the third pad metal layers 135*c*, driving of the light emitting diode is not adversely affected.

Furthermore, since the third bump pads 39*c* are disposed on the third pad metal layers 135*c*, heat generated in the light emitting cells C2 through C5 may be better dissipated. In particular, the third pad metal layers 139*c* may be connected to the third bump pads 39*c* disposed thereon, thereby further improving heat dissipation characteristics.

Figure 11:
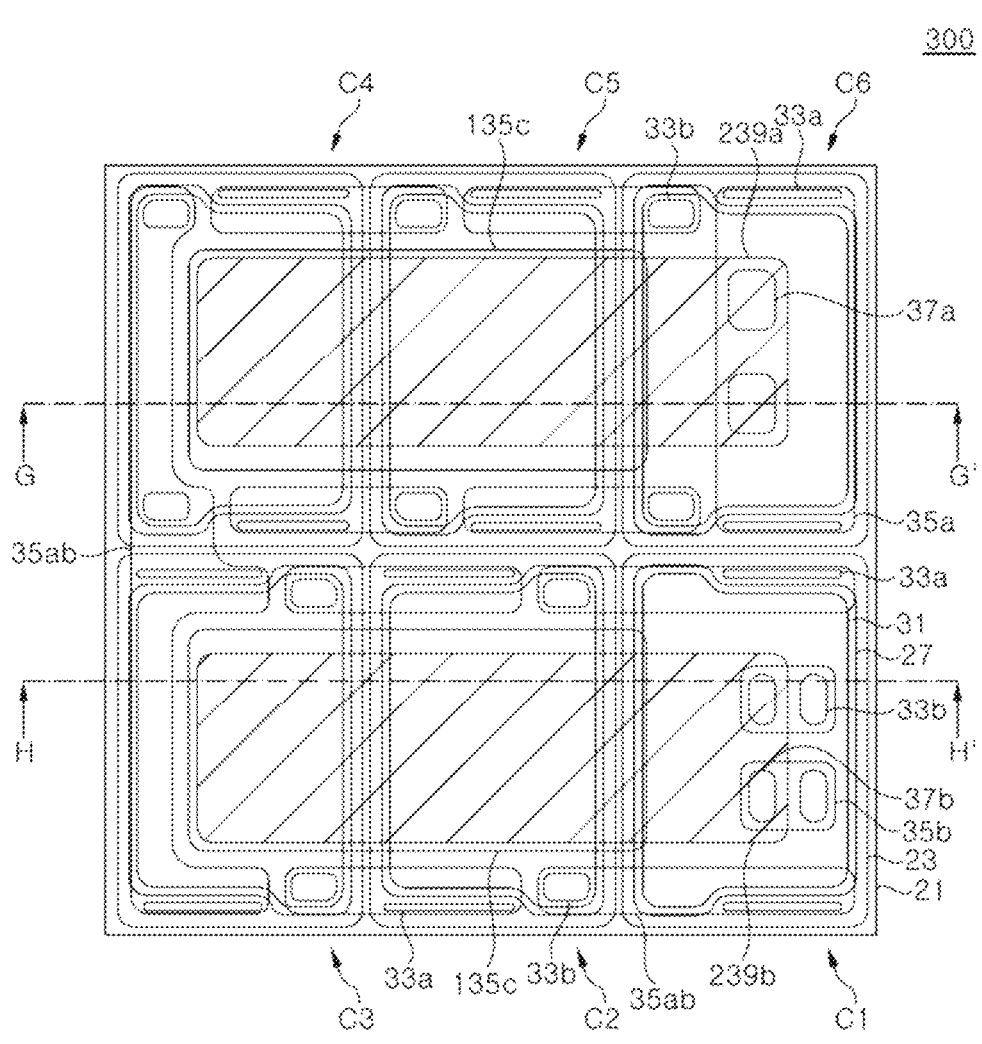
FIG. 11 is a schematic plan view illustrating a light emitting diode according to another embodiment of the present disclosure.
Figure 12A:
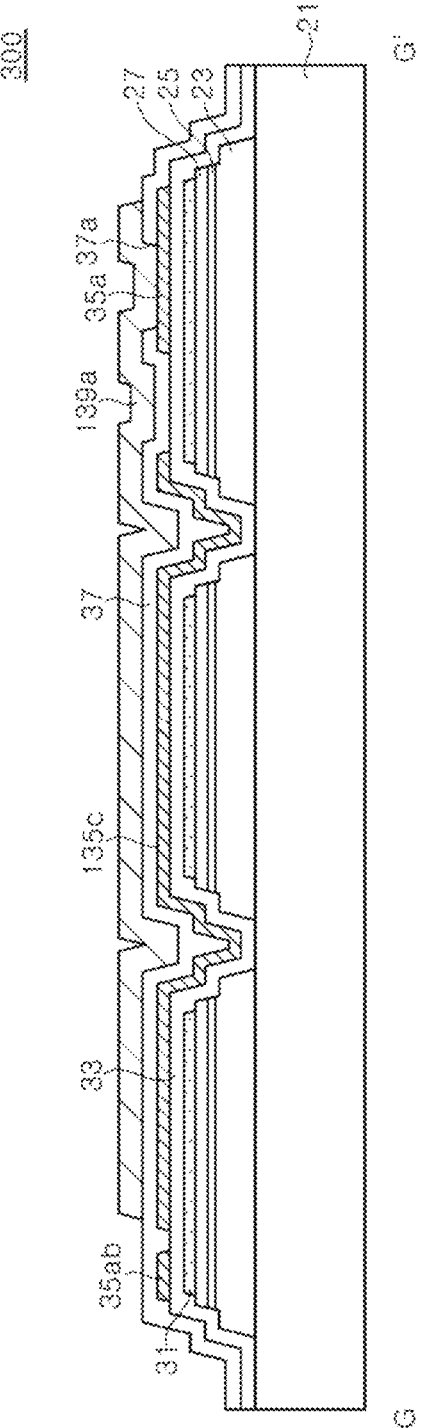
FIG. 12A is a schematic cross-sectional view taken along line G-G' in FIG. 11.
Figure 12B:
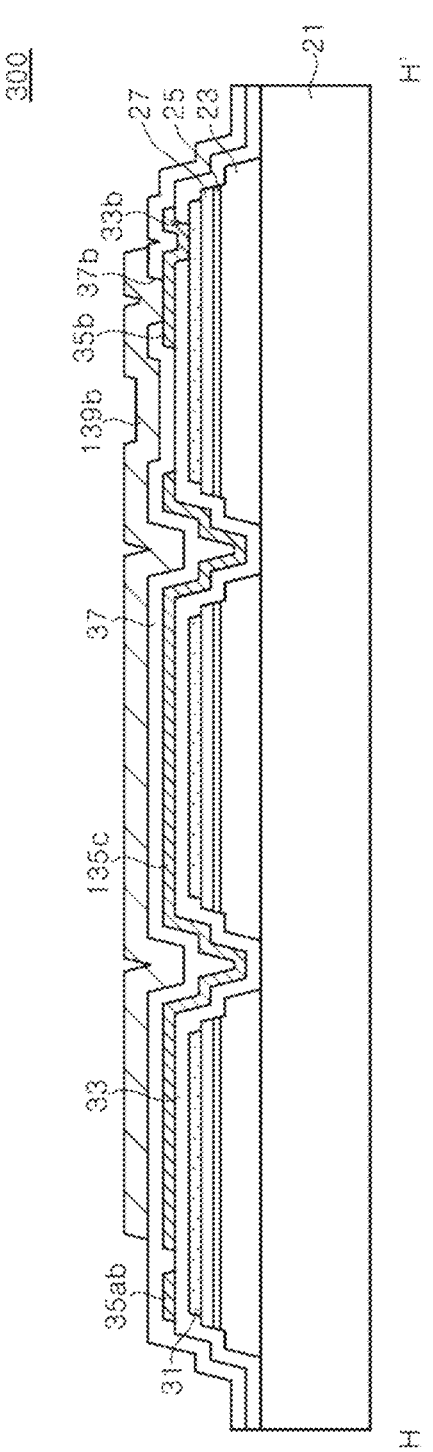
FIG. 12B is a schematic cross-sectional view taken along line H-H' in FIG. 11.

FIG. 11 is a schematic plan view illustrating a light emitting diode 300 according to another embodiment of the present disclosure, FIG. 12A is a schematic cross-sectional view taken along line G-G' in FIG. 11, and FIG. 12B is a schematic cross-sectional view taken along line H-H' in FIG. 11.

Referring to FIGS. 11, 12A, and 12B, the light emitting diode 300 according to this embodiment is generally similar to the light emitting diode 200 described with reference to FIGS. 9, 10A, and 10B, except that the third bump pads 39*c* are omitted, and first and second bump pads 239*a* and 239*b* are disposed across the plurality of light emitting cells.

The first bump pad 239*a* is disposed across the fourth, fifth, and sixth light emitting cells C4, C5, and C6, and the second bump pad 239*b* is disposed across the first, second, and third light emitting cells C1, C2, and C3. The first and second bump pads 239*a* and 239*b* overlap the third pad metal layer 135*c* on each of the light emitting cells. However, a region where the second bump pad 239*b* overlaps the third pad metal layer 135*c* on the first light emitting cell C1 is smaller than a region where the second bump pad 239*b* overlaps on each of other light emitting cells C2 and C3. In addition, a region where the first bump pad 239*a* overlaps the third pad metal layer 135*c* on the sixth light emitting cell C6 is smaller than a region where the first bump pad 239*a* overlaps on each of other light emitting cells C4 and C5. Therefore, when measuring electrical characteristics of the first and second bump pads 239*a* and 239*b* using probes, the probes may be set to contact the upper portions of the first light emitting cell C1 and the sixth light emitting cell C6, and even when the first and second bump pads 239*a* and 239*b* are damaged, it is possible to prevent the first and second bump pads 239*a* and 239*b* from being electrically shorted with the third pad metal layer 135*c*.

Figure 13:
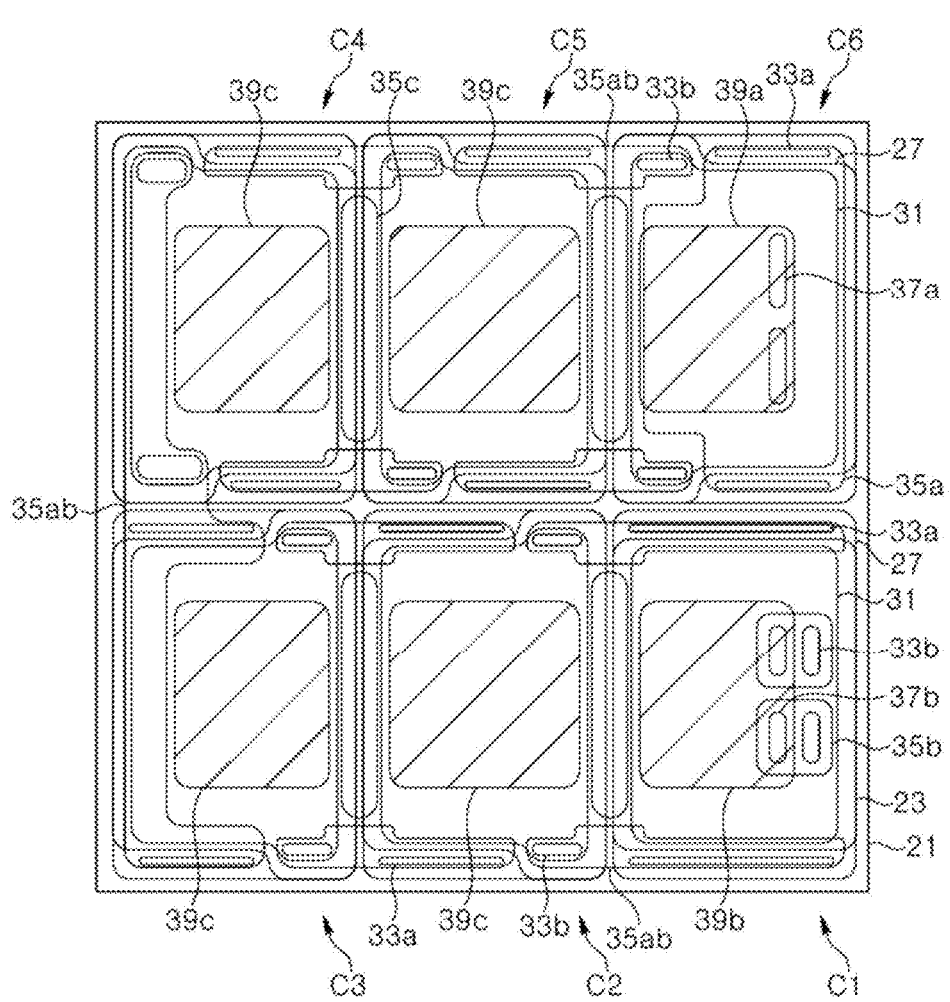
FIG. 13 is a schematic plan view illustrating a light emitting diode according to another embodiment of the present disclosure.

FIG. 13 is a schematic plan view illustrating a light emitting diode 400 according to another embodiment of the present disclosure.

Referring to FIG. 13, the light emitting diode 400 according to this embodiment is substantially similar to the light emitting diode 100 of the above-described embodiment, except that the first pad electrode 35*a*, the connector 35*ab*, the mesa, and others are modified. Hereinafter, descriptions of elements that are substantially same as those of the light emitting diode 100 among those of the light emitting diodes 400 of this embodiment will be omitted and differences will be described in detail.

In this embodiment, a position of the upper surface of the first conductivity type semiconductor layer 23 exposed around the mesa is limited. Side surfaces of the first conductivity type semiconductor layer 23 and the second conductivity type semiconductor layer 27 may be inclined similarly to the light emitting diode 100 of the previous embodiment. However, except for an upper portion of the first conductivity type semiconductor layer 23 where the first openings 33*a* of the lower insulation layer 33 are disposed, the side surfaces of the second conductivity type semiconductor layer 27 may be flush with the side surfaces of the first conductivity type semiconductor layer 23. For example, in FIG. 13, left and right side surfaces of the second conductivity type semiconductor layer 27 may be flush with the side surfaces of the first conductivity type semiconductor layer 23. Meanwhile, the upper surface of the first conductivity type semiconductor layer 23 is exposed around the upper and lower side surfaces of the second conductivity type semiconductor layer 27. In addition, as it can be seen in the first light emitting cell C1 of FIG. 13, all of the upper surface of the first conductivity type semiconductor layer 23 around the upper and lower sides of the second conductivity type semiconductor layer 27 may be exposed, and as it can be seen in the second through sixth light emitting cells C2 through C6, portions of the upper and lower side surfaces of the second conductivity type semiconductor layer 27 may be flush with the side surfaces of the first conductivity type semiconductor layer 23.

Meanwhile, the first pad metal layer 35*a* may extend to a region between the connectors 35*ab*. Accordingly, the first pad metal layer 35*a* includes a region having a relatively narrow width vertically and a region having a relatively wide width. The region having the relatively narrow width is disposed close to an adjacent light emitting cell C5. In addition, the second openings 33*b* of the lower insulation layer 33 may be disposed on both sides of the region having the relatively narrow width.

The connectors 35*ab* electrically connect the first conductivity type semiconductor layer 23 and the second conductivity type semiconductor layer 27 of adjacent light emitting cells. The connectors 35*ab* may electrically connect the first conductivity type semiconductor layer 23 and the ohmic electrode layer 31 exposed through the openings 33*a* and 33*b* to each other. As shown in FIG. 13, terminals of the connectors 35*ab* connecting the fifth light emitting cell C5 and the sixth light emitting cell C6 may extend to the both sides of the region having the relatively narrow width of the first pad metal layer 35*a* to be electrically connected to the first conductivity type semiconductor layer 23 through the second openings 33*b*.

The connectors 35*ab* pass through regions between adjacent light emitting cells. In this embodiment, the connectors 35*ab* do not have a constant width, but have relatively wider widths in the regions between the light emitting cells. Accordingly, it is possible to improve an electrical reliability of the light emitting diode by preventing disconnection of the connectors 35*ab*.

Meanwhile, in this embodiment, among the first openings 33*a* of the lower insulation layer 33, first openings 33*a* formed on the first light emitting cell C1 may have a shape different from that of the first openings 33*a* formed on other light emitting cells C2 through C6. That is, the first openings 33*a* on the first light emitting cell C1 may be formed to have a relatively elongated shape compared to that of the first openings 33*a* formed on the other light emitting cells C2 through C6. Accordingly, the connectors 35*ab* may be connected lengthily to the first conductivity type semiconductor layer 23 of the first light emitting cell C1, thereby assisting current spreading in the first light emitting cell C1.

Figure 14:
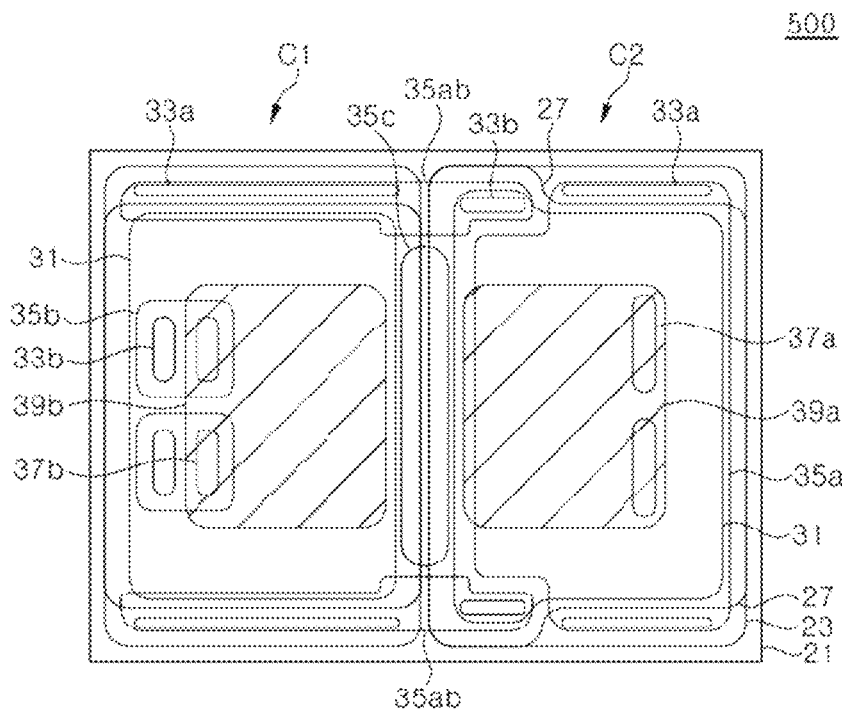
FIG. 14 is a schematic plan view illustrating a light emitting diode according to another embodiment of the present disclosure.

FIG. 14 is a schematic plan view illustrating a light emitting diode 500 according to another embodiment of the present disclosure.

Referring to FIG. 14, the light emitting diode 500 according to this embodiment is substantially similar to the light emitting diode 400 described with reference to FIG. 13, except that it is composed of only two light emitting cells C1 and C2. Accordingly, the light emitting cells C1 and C2 of this embodiment are similar to the first light emitting cell C1 and the sixth light emitting cell C6 connected in the light emitting diode 400.

Figure 15:
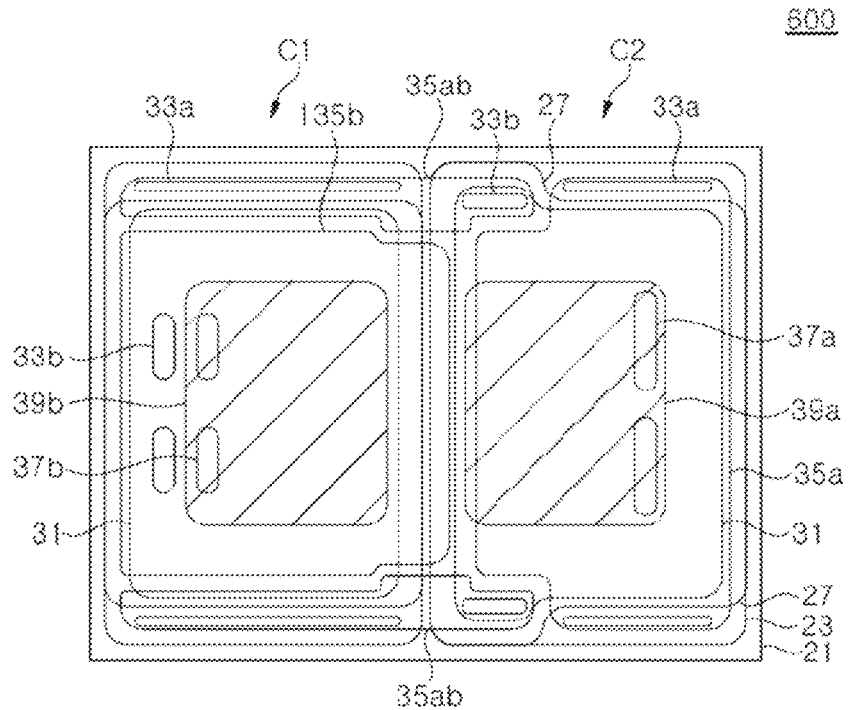
FIG. 15 is a schematic plan view illustrating a light emitting diode according to another embodiment of the present disclosure.

FIG. 15 is a schematic plan view illustrating a light emitting diode 600 according to another embodiment of the present disclosure.

Referring to FIG. 15, the light emitting diode 600 according to this embodiment is substantially similar to the light emitting diode 500 described with reference to FIG. 14, except that a shape and an arrangement position of a second pad metal layer 135*b*.

The second pad metal layer 135*b* is disposed across two light emitting cells C1 and C2. The second pad metal layer 135b partially overlaps the ohmic reflection layer 31 of the first light emitting cell C1, and extends to the upper region of the second light emitting cell C2. The second pad metal layer 135b covers a region between the first and second light emitting cells C1 and C2 to perform a reflection role of the third pad metal layer 35c. Accordingly, in this embodiment, the third pad metal layer 35c is omitted.

The second pad metal layer 135b may have a relatively narrow width at the boundary between the first and second light emitting cells C1 and C2 in order that connectors 35ab have relatively wide widths at a boundary between the first and second light emitting cells C1 and C2.

Although various embodiments of the present invention have been described above, the present invention is not limited to these embodiments, and various modifications may be made without departing from the scope of the present invention.

The invention claimed is:

1. A light emitting diode, comprising:
light emitting cells, each including a first conductivity type semiconductor layer, an active layer, and a second conductivity type semiconductor layer, and arranged in a matrix;
ohmic reflection layers disposed to electrically contact with second conductivity type semiconductor layers of the light emitting cells;
a lower insulation layer covering the light emitting cells and the ohmic reflection layers, the lower insulation layer having openings exposing the first conductivity type semiconductor layer and an ohmic reflection layer of each of the light emitting cells;
a connector disposed on the lower insulation layer, and configured to electrically connect adjacent light emitting cells in series to form a serial array of light emitting cells disposed between a first terminal and a second terminal of the serial array;
a first pad metal layer electrically connected to the first conductivity type semiconductor layer of a last light emitting cell connected to the second terminal of the serial array through an opening of the lower insulation layer;
a second pad metal layer electrically connected to the ohmic reflection layer of a first light emitting cell disposed at a first terminal of the serial array through the opening of the lower insulation layer;
a third pad metal layer disposed on the lower insulation layer, and spaced apart from the connector, and the first and second pad metal layers;
an upper insulation layer covering the connector and the first through third pad metal layers, and having openings exposing upper surfaces of the first and second pad metal layers, respectively; and
a first bump pad and a second bump pad that are connected to the upper surfaces of the first pad metal layer and the second pad metal layer, respectively, the first pad metal layer and the second pad metal layer exposed by the openings of the upper insulation layer,
wherein the third pad metal layers cover a cell isolation region between adjacent light emitting cells, and are disposed between a first portion of the connector and a second portion of the connector that are configured to electrically connect adjacent light emitting cells,
wherein the first bump pad overlaps the third pad metal layers,
wherein a region where the first bump pad overlaps the third pad metal layer over the last light emitting cell is smaller than a region where the first bump pad overlaps the third pad metal layer over another adjacent light emitting cell.

2. The light emitting diode of claim 1,
wherein the third pad metal layers are spaced apart from the first and second bump pads in a lateral direction so as not to overlap the first and second bump pads.

3. The light emitting diode of claim 2,
wherein the third pad metal layers partially overlap the ohmic reflection layers over the adjacent light emitting cells.

4. The light emitting diode of claim 2, further comprising:
third bump pads disposed on light emitting cells, respectively, other than the first light emitting cell and the last light emitting cell.

5. The light emitting diode of claim 4,
wherein the third pad metal layers are spaced apart from the third bump pads in a lateral direction so as not to overlap the third bump pads.

6. The light emitting diode of claim 4, wherein:
each of the third pad metal layers is disposed across all light emitting cells in one row, and
each of the third bump pads overlaps one of the third pad metal layers.

7. The light emitting diode of claim 6,
wherein the third bump pads are connected to the third pad metal layers.

8. The light emitting diode of claim 1, wherein:
each of the third pad metal layers is disposed across all light emitting cells in one row, and
each of the first and second bump pads is disposed across all light emitting cells in one row.

9. The light emitting diode of claim 8, wherein:
the second bump pads overlaps the third pad metal layers, and
a region where the second bump pad overlaps the third pad metal layer over the first light emitting cell is smaller than a region where the second bump pad overlaps the third pad metal layer over another adjacent light emitting cell.

10. The light emitting diode of claim 1,
wherein the first pad metal layer is disposed within an upper region of the last light emitting cell, and the second pad metal layer is disposed within an upper region of the first light emitting cell.

11. The light emitting diode of claim 10, wherein:
the light emitting cells include a mesa disposed on the first conductivity type semiconductor layer,
the mesa includes the active layer and the second conductivity type semiconductor layer, and
the first pad metal layer covers a portion of a side surface of the mesa of the last light emitting cell.

12. The light emitting diode of claim 11,
wherein the second pad metal layer is disposed in an upper region of the ohmic reflection layer on the first light emitting cell.

13. The light emitting diode of claim 11,
wherein the second pad metal layer covers a portion of a side surface of the mesa of the first light emitting cell.

14. The light emitting diode of claim 1,
wherein light emitting cells adjacent to each other in one row of the light emitting cells are electrically connected to each other by the first portion of the connector and the second portion of the connector that are disposed near both edges of each of the light emitting cells.

15. The light emitting diode of claim 14,
wherein light emitting cells in different rows are electri-
cally connected to one another by one connector.

16. The light emitting diode of claim 1,
wherein the opening of the lower insulation layer expos-
ing an ohmic reflection layer and the opening of the
upper insulation layer exposing the second pad metal
layer are spaced apart in a lateral direction so as not to
overlap each other.

* * * * *